US012015428B2

(12) United States Patent
Ware et al.

(10) Patent No.: US 12,015,428 B2
(45) Date of Patent: Jun. 18, 2024

(54) MAC PROCESSING PIPELINE USING FILTER WEIGHTS HAVING ENHANCED DYNAMIC RANGE, AND METHODS OF OPERATING SAME

(71) Applicant: Flex Logix Technologies, Inc., Mountain View, CA (US)

(72) Inventors: Frederick A Ware, Los Altos Hills, CA (US); Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 777 days.

(21) Appl. No.: 17/074,670

(22) Filed: Oct. 20, 2020

(65) Prior Publication Data

US 2021/0132905 A1  May 6, 2021

Related U.S. Application Data

(60) Provisional application No. 62/930,601, filed on Nov. 5, 2019.

(51) Int. Cl.
*H03M 7/24* (2006.01)
*G06F 7/544* (2006.01)

(52) U.S. Cl.
CPC ............ *H03M 7/24* (2013.01); *G06F 7/5443* (2013.01); *G06F 2207/3824* (2013.01)

(58) Field of Classification Search
CPC .................. G06F 7/5443; G06F 9/3893; G06F 2207/3824; H03M 7/24
See application file for complete search history.

(56) References Cited

U.S. PATENT DOCUMENTS

| 4,958,312 A | 9/1990 | Ang et al. |
| 6,115,729 A | 9/2000 | Matheny et al. |

(Continued)

FOREIGN PATENT DOCUMENTS

| EP | 0405726 | 3/1999 |
| EP | 2280341 | 6/2013 |
| WO | WO 2018/126073 | 7/2018 |

OTHER PUBLICATIONS

Liang Yun, et al., "Evaluating Fast Algorithms for Convolutional Neural Networks on FPGAs", IEEE Transactions on Computer-Aided Design of Integrated Circuits and Systems, vol. 39, No. 4, Feb. 5, 2019, 14 pages (Note: The date identified on the article attached is Mar./Apr. 2020).

(Continued)

*Primary Examiner* — Matthew D Sandifer
(74) *Attorney, Agent, or Firm* — Charles Shemwell

(57) ABSTRACT

A system and/or an integrated circuit including: (a) a multiplier-accumulator execution pipeline including multiplier-accumulator circuits to process image data, using associated filter weights, via a plurality of multiply and accumulate operations and (b) first data format conversion circuitry including (i) inputs to receive filter weights of a plurality of sets of filter weights, wherein each set includes a plurality of filter weights each having a block-scaled fraction data format, (ii) conversion circuitry, coupled to the inputs, to convert the filter weights of each set from the block-scaled fraction data format to a floating point data format, and (iii) outputs to output the filter weights having the floating point data format. In operation, the multiplier-accumulator circuits of the pipeline are configured to perform the plurality of multiply and accumulate operations using (a) the image data and (b) the filter weights having the floating point data format.

15 Claims, 27 Drawing Sheets

(56) References Cited

U.S. PATENT DOCUMENTS

| | | | |
|---|---|---|---|
| 6,148,101 | A | 11/2000 | Tanaka et al. |
| 6,298,366 | B1 | 10/2001 | Gatherer et al. |
| 7,107,305 | B2 | 9/2006 | Deng et al. |
| 7,299,342 | B2 | 11/2007 | Nilsson et al. |
| 7,346,644 | B1 | 3/2008 | Langhammer et al. |
| 7,698,358 | B1 | 4/2010 | Langhammer et al. |
| 8,051,124 | B2 | 11/2011 | Salama et al. |
| 8,645,450 | B1 | 2/2014 | Choe et al. |
| 8,751,551 | B2 | 6/2014 | Streicher et al. |
| 8,788,562 | B2 | 7/2014 | Langhammer et al. |
| 9,600,278 | B1 | 3/2017 | Langhammer |
| 11,455,368 | B2 * | 9/2022 | Ware .................. G06T 1/20 |
| 2003/0172101 | A1 | 9/2003 | Liao et al. |
| 2005/0144215 | A1 | 6/2005 | Simkins et al. |
| 2007/0239967 | A1 | 10/2007 | Dally et al. |
| 2008/0211827 | A1 | 9/2008 | Donovan et al. |
| 2009/0094303 | A1 | 4/2009 | Katayama |
| 2014/0019727 | A1 | 1/2014 | Zhu et al. |
| 2014/0281370 | A1 | 9/2014 | Khan |
| 2017/0011288 | A1 | 1/2017 | Brothers et al. |
| 2017/0115958 | A1 | 4/2017 | Langhammer |
| 2017/0116693 | A1 | 4/2017 | Rae et al. |
| 2017/0214929 | A1 | 7/2017 | Susnow et al. |
| 2017/0315778 | A1 | 11/2017 | Sano |
| 2017/0322813 | A1 | 11/2017 | Langhammer |
| 2017/0344876 | A1 * | 11/2017 | Brothers ............ G06N 3/082 |
| 2018/0052661 | A1 | 2/2018 | Langhammer |
| 2018/0081632 | A1 | 3/2018 | Langhammer |
| 2018/0081633 | A1 | 3/2018 | Langhammer |
| 2018/0157465 | A1 * | 6/2018 | Bittner ................ G06F 7/52 |
| 2018/0157961 | A1 | 6/2018 | Henry et al. |
| 2018/0173571 | A1 | 6/2018 | Huang et al. |
| 2018/0189651 | A1 | 7/2018 | Henry et al. |
| 2018/0300105 | A1 | 10/2018 | Langhammer |
| 2018/0321909 | A1 | 11/2018 | Langhammer |
| 2018/0321910 | A1 | 11/2018 | Langhammer et al. |
| 2018/0341460 | A1 | 11/2018 | Langhammer |
| 2018/0341461 | A1 | 11/2018 | Langhammer |
| 2019/0042191 | A1 | 2/2019 | Langhammer |
| 2019/0042244 | A1 | 2/2019 | Henry et al. |
| 2019/0042544 | A1 | 2/2019 | Kashyap et al. |
| 2019/0042923 | A1 * | 2/2019 | Janedula ............. G06N 3/044 |
| 2019/0079728 | A1 | 3/2019 | Langhammer et al. |
| 2019/0114536 | A1 | 4/2019 | Tsung et al. |
| 2019/0196786 | A1 | 6/2019 | Langhammer |
| 2019/0243610 | A1 | 8/2019 | Lin et al. |
| 2019/0250886 | A1 | 8/2019 | Langhammer |
| 2019/0286417 | A1 | 9/2019 | Langhammer |
| 2019/0310828 | A1 | 10/2019 | Langhammer et al. |
| 2019/0324722 | A1 | 10/2019 | Langhammer |
| 2019/0340489 | A1 | 11/2019 | Mills |
| 2020/0004506 | A1 | 1/2020 | Langhammer et al. |
| 2020/0026493 | A1 | 1/2020 | Streicher et al. |
| 2020/0097799 | A1 | 3/2020 | Divakar et al. |
| 2020/0076435 | A1 | 6/2020 | Wang |
| 2020/0174750 | A1 | 6/2020 | Langhammer |
| 2020/0234124 | A1 | 7/2020 | Park |
| 2020/0310818 | A1 | 10/2020 | Ware et al. |
| 2020/0326939 | A1 | 10/2020 | Ware et al. |
| 2020/0326948 | A1 | 10/2020 | Langhammer |
| 2020/0401414 | A1 | 12/2020 | Ware et al. |
| 2021/0081211 | A1 | 3/2021 | Wang |
| 2021/0103630 | A1 * | 4/2021 | Ware .................. G06T 1/20 |
| 2021/0263993 | A1 * | 8/2021 | Urbanski ............ G06F 7/5443 |
| 2022/0374492 | A1 * | 11/2022 | Ware .................. G06F 17/14 |

OTHER PUBLICATIONS

Priyanka Nain, "Multiplier-Accumulator (MAC) Unit", IJDACR, vol. 5, Issue 3, Oct. 2016, 4 pages.

Jebashini et al., "A Survey and Comparative Analysis of Multiply-Accumulate (MAC) Block for Digital Signal Processing Application on ASIC and FPGA", Journal of Applied Science, vol. 15, Issue 7, pp. 934-946, Jul. 2015.

Agrawal et al., "A 7nm 4-Core AI Chip with 25.6TFLOPS Hybrid FP8 Training, 102.4TOPS INT4 Inference and Workload-Aware Throttling", ISSCC, pp. 144-145, 2021.

Linley Gwennap, "IBM Demonstrates New AI Data Types", Microprocessor Report, Apr. 2021.

Choi et al., "Accurate and Efficient 2-Bit Quantized Neural Networks", Proceedings of $2^{nd}$ SysML Conf, 2019, 12 pages.

Sun et al., "Hybrid 8-bit Floating Point (HFP8) Training and Inference for Deep Neural Networks", NeurIPS 2019, 10 pages.

"nVidia A100 Tensor Core GPU Architecture", v1.0, 2020, 82 pages.

Papadantonakis et al., "Pipelining Saturated Accumulation", IEEE, vol. 58, No. 2, pp. 208-219, Feb. 2009.

Lian et al., "High-Performance FPGA-Based CNN Accelerator With Block-Floating-Point Arithmetic", IEEE Transactions on VLSI Systems, vol. 27, No. 8, Aug. 1, 2019, pp. 1874-1885.

Zhao et al., "A Fast Algorithm for Reducing the Computation Complexity of Convolutional Neural Networks", Algorithms 2018, 11, 159; doi:10.3390/a11100159; www. Mdpi.com/journal/algorithms, 11 pages, Oct. 2018.

* cited by examiner

Exemplary Floating point formats

FP32 | S | EEEEEEEE | FFFFFFFFFFFFFFFFFFFFFFF |
   1      8                23

Range = ±{INF, $2^{+127}$ to $2^{-127}$, ZERO}

FP24 | S | EEEEEEEE | FFFFFFFFFFFFFFF |
   1      8               15

Range = ±{INF, $2^{+127}$ to $2^{-127}$, ZERO}

FP16 | S | EEEEEEEE | FFFFFFF |
   1      8           7
         ↳ Binary point

Range = ±{INF, $2^{+127}$ to $2^{-127}$, ZERO}

Example - FP16 Value = $(-1)^S * 2^{E-127} * 1.FFFFFFF$
...Note the hidden (implicit) bit with value 1.0

Exemplary Fixed point formats

INT32 | S | FFFFFFFFFFFFFFFFFFFFFFFFFFFFFFF |
    1       31

Range = { $±2^0$ to $±2^{+31}$, ZERO }

INT16 | S | FFFFFFFFFFFFFFF |
    1       15
         ↳ Binary point

Range = { $±2^0$ to $±2^{+15}$, ZERO }

INT8 | S | FFFFFFF |
    1      7

Range = { $±2^0$ to $±2^{+7}$, ZERO }

Example - INT16 Value = $[ (-1)^S * 2^{15} ] + FFFFFFFFFFFFFFF$.

FIG. 1C

Pseudo-code
```
For i=0,Dw-1
  For j=0,Dh-1
    For l=0,Yd-1
      For k=0,Dd-1
        Yijlk ← 0
        For m=0,M-1    (where M = 3x3)
          Yijlk ← 0
          Yijlk ← SumM(Dijkm * Fklm)
        Yijl ← SumK(Yijlk)
```

FIG. 2B

Exemplary Embodiment - Conversion of Format of Filter Coefficients - BSF7 to Floating Point (FP16)

Pseudo-code
```
For i=0,Dw-1,2
  For j=0,Dh-1,2
    For l=0,Yd-1
      For m=0,M-1
        Zijlm ← 0
        For k=0,Dd-1
          Eijkm ← FunctionE(Dijkm)
          Hklm  ← FunctionH(Fklm)
          Zijlm ← SumK(Eijkm * Hklm)
          Yijkn ← FunctionY(Zijkm)
```

FIG. 4B

Exemplary Embodiment – RSV bit to Select/Enable Predetermined Format of Filter Coefficients RSV=0 (original format)

$F_{00}$ | S | 0 | 1 | F | F | F | F |
$F_{10}$ | S | 1 | F | F | F | F | F |
$F_{20}$ | S | 1 | F | F | F | F | F |
$F_{01}$ | S | 0 | 0 | 1 | F | F | F |
$F_{11}$ | S | 0 | 0 | 1 | F | F | F |
$F_{21}$ | S | 0 | 1 | F | F | F | F |
$F_{02}$ | S | 1 | F | F | F | F | F |
$F_{12}$ | S | 1 | F | F | F | F | F |
$F_{22}$ | S | 0 | 0 | 0 | 1 | F |

EMAX | 0

RSV=1 (alternate format)

$F_{00}$ | S | 1 | F | F | F | 0 | 1 |
$F_{10}$ | S | 1 | F | F | F | 0 | 1 |
$F_{20}$ | S | 1 | F | F | F | 0 | 0 |
$F_{01}$ | S | 1 | F | F | F | 0 | 0 |
$F_{11}$ | S | 1 | F | F | F | 1 | 1 |
$F_{21}$ | S | 1 | F | F | F | 1 | 0 |
$F_{02}$ | S | 1 | F | F | F | 0 | 1 |
$F_{12}$ | S | 1 | F | F | F | 0 | 0 |
$F_{22}$ | S | 0 | 1 | F | F | 1 | 1 |

EMAX | 1

This two bit EE field for each of the weights or coefficients is subtracted from EMAX to give the exponent field EXP[i] for each BSF7 value

FIG. 6

Exemplary Embodiment – Conversion of Floating Point Format (here, FP16) to Fixed Point Format (here, BSF7)

Filter weights in FP data format (FP16) ····· convert ·····▸ Filter weights in BSF data format (BSF7)
(e.g., Fkl)  (e.g., Gkl)

[2] Note the explicit bit with value 1.0

[3] Right-shift the fractions of the elements with smaller exponents: the number of leading zeros is equal to the difference of [EMAX-EXP(F00)]

[4] values with right-shift > 7 will need the fraction to be rounded

[5] Negative values (S=1) may be converted to two's complement (invert the 8 bits and increment) – not illustrated here

[1] compare the exponents of 9 associated filter weights to identify or determine largest (EMAX = EXP($F_{20}$))

Inset A

Filter Weights (first data format) → Data Format Conversion Circuitry → Filter Weights (second data format)

FIG. 9

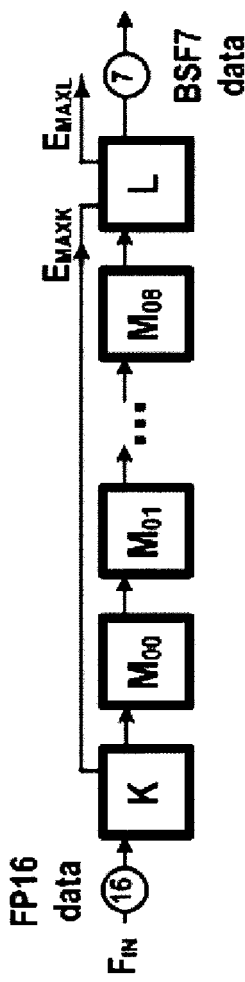

The figure illustrates an exemplary implementation of a FP16-to-BSF7 conversion pipeline in relation to the format conversion of the initial filter weights from a first format to a second format. In this exemplary implementation, the filter weights or coefficients are converted, via conversion circuitry, from a floating point format to a fixed point format. Specifically, the Fij input values are in FP16 format, and the Gij output values are BSF7 format.

The K cell receives the 3x3 Fij values in FP16 format sequentially and identifies and/or determines the largest exponent (EMAX). The M cells perform a delay function for the aforementioned exponent search. The L cell performs the FP16 to BSF7 format conversion of the Fij elements (using the EMAX value).

FIG. 10A

MAC PROCESSING PIPELINE USING FILTER WEIGHTS HAVING ENHANCED DYNAMIC RANGE, AND METHODS OF OPERATING SAME

RELATED APPLICATION

This non-provisional application claims priority to and the benefit of U.S. Provisional Application No. 62/930,601, entitled "Processing Pipeline Circuitry using Filter Coefficients having Enhanced Dynamic Range and Methods of Using Same", filed Nov. 5, 2019. The '601 provisional application is hereby incorporated herein by reference in its entirety.

INTRODUCTION

There are many inventions described and illustrated herein. The present inventions are neither limited to any single aspect nor embodiment thereof, nor to any combinations and/or permutations of such aspects and/or embodiments. Importantly, each of the aspects of the present inventions, and/or embodiments thereof, may be employed alone or in combination with one or more of the other aspects of the present inventions and/or embodiments thereof. All combinations and permutations thereof are intended to fall within the scope of the present inventions.

In one aspect, the present inventions are directed to one or more integrated circuits having multiplier-accumulator circuits (and methods of operating such circuits) including a data processing pipeline for filtering (e.g., image filtering) data using filter coefficients or weights, employed in the multiply operations of the plurality of multiplier-accumulator circuits (referred to herein, at times, as "MACs" or "MAC circuits" and singly as "MAC" or "MAC circuit") of the data processing pipeline, that are converted at least once, via data format conversion circuitry, from a first data format (e.g., integer data format or floating point data format) to a second data format (e.g., fixed point data format such as block-scaled fraction data format) wherein the second data format of the filter coefficients or weights, relative to the first data format, includes a larger or wider dynamic range. In one embodiment, the filter coefficients or weights, having the second data format providing the larger dynamic range, may be employed by the data processing circuitry of the pipeline to filter input data (e.g., image data) via the multiply circuits of the plurality of multiplier-accumulator circuits of the processing pipeline in connection with the multiply operations. In another embodiment, the filter coefficients or weights, having the second data format providing the larger dynamic range may (in addition to or in lieu of immediate processing) be stored in memory resident on/in the integrated circuit of multiplier-accumulator circuitry for subsequent processing by the circuitry of the data processing pipeline(s). In either embodiment, the change in data format of the filter weights (first data format to second data format) increases the dynamic range of the filter coefficients or weights, while the memory footprint/allocation corresponding to the filter coefficients in the second data format is the same or substantially the same as the memory footprint/allocation corresponding to the plurality of filter coefficients in the first data format.

In one embodiment of the present inventions, the filter coefficients or weights, having the second data format, may be converted further, via conversion circuitry, to filter coefficients or weights having a third data format which is different from the second data format (e.g., filter coefficients having the fixed point data format may be converted to filter coefficients having a floating point data format). In one embodiment, the third data format may be the same as the first data format but different from the second data format. In another embodiment, the third data format is different from the first data format and the second data format. In either embodiment, the filter coefficients, having the third data format, may be immediately applied to or input into the data processing circuitry of a processing pipeline(s) to filter input data (e.g., image data) via multiply circuits of the plurality of multiplier-accumulator circuits of the processing pipeline(s), and/or stored in memory and available to multiplier-accumulator circuitry of the data processing pipeline(s) for subsequent processing.

In another embodiment of the present inventions, the filter coefficients or weights, having the second data format, may be converted further, via conversion circuitry, to filter coefficients or weights having the second data format and an increase in the number of bits (i.e., bit width, length or size) in the fraction field. As such, in this embodiment, the data format of the filter coefficients is the same but the bit width, length or size of the filter coefficients or weights, having the second data format, is adjusted or modified, via conversion circuitry (e.g., filter coefficients or weights, having a second data format, being increased in width, length or size). For example, the filter coefficients or weights, having the second data format (e.g., block-scaled fraction data format) may be modified from a first length (e.g., 7 bits) to a second length (e.g., 12 bits).

Thereafter, the filter coefficients, having the modified or adjusted length, are processed/converted, via Winograd conversion circuitry, to a Winograd format to facilitate Winograd type processing via the multiplier-accumulator circuitry. The filter coefficients in a Winograd format may be stored in memory and/or immediately applied to or input into multiplier-accumulator circuitry of the execution pipeline in connection with the multiply and accumulate operations during processing of input data (e.g., image data). For example, the multiplier-accumulator circuitry of the present inventions may implement Winograd processing techniques to process the input data (e.g., image data) using filter weights, in a Winograd format, which may have a fixed point data format or a floating point data format—via circuitry, architectures, functions processes and operations of the multiplier-accumulator execution pipelines implementing Winograd processing techniques that are described and/or illustrated in U.S. Non-Provisional patent application Ser. No. 16/796,111, entitled "Multiplier-Accumulator Circuitry having Processing Pipelines and Methods of Operating Same", filed Feb. 20, 2020 and/or U.S. Provisional Patent Application No. 62/823,161, entitled "Multiplier-Accumulator Circuitry having Processing Pipeline and Methods of Operating and Using Same", filed Mar. 25, 2019. In addition thereto, or in lieu thereof, the multiplier-accumulator circuitry of the present inventions may implement Winograd processing techniques (including the circuitry, structures, architectures, function and operation of the multiplier-accumulator execution pipelines implementing Winograd processing techniques) to process the image data described and/or illustrated in U.S. Non-Provisional patent application Ser. No. 17/031,631, entitled "MAC Processing Pipeline having Conversion Circuitry, and Methods of Operating Same", filed Sep. 24, 2020, and/or U.S. Provisional Patent Application No. 62/909,293, entitled "Multiplier-Accumulator Circuitry Processing Pipeline and Methods of Operating Same", filed Oct. 2, 2019. The aforementioned four (4) patent applications are incorporated herein by reference.

In one embodiment, a plurality of filter coefficients or weights are associated or arranged in groups (e.g., nine filter coefficients in each group wherein each group may be arranged in and/or employed as a matrix or block of filter weights (e.g., a 3×3 matrix)). For example, in one illustrative embodiment, a multiplier-accumulator execution pipeline (having a plurality of multiplier-accumulator circuits) concurrently processes a plurality of associated input data/values (e.g., nine input data/values wherein the associated input data/values may also be arranged in and/or employed as a matrix or block (e.g., a 3×3 matrix)). In this embodiment, input data (e.g., image data/pixel) are stored in and/or output from memory (e.g., which is organized in planes or layers) consisting of blocks or two-dimensional arrays of input or image data/pixels (M×M, e.g., where M=3). The input or image data/pixels of each two-dimensional array (e.g., 3×3 array or set of data) correlates with/to or contributes to an output data value. The memory (the same or different memory that stores the input data) stores the associated filter weights or coefficients, and may also output the filter weights or coefficients in blocks or arrays (M×M, e.g., where M=3).

In one embodiment, the execution pipeline (having a plurality of multiplier-accumulator processing circuits) concurrently processes a plurality of associated input data/values (e.g., nine input data/values wherein the associated input data/values may be arranged in, input into the processing circuitry and/or employed as a matrix (e.g., a 3×3) or block using a plurality of filter weights or coefficients associated therewith (e.g., nine associated filter coefficients in each group wherein each group may be arranged, in input into the processing circuitry and/or employed as a matrix (e.g., a 3×3) or block). In this embodiment, the plurality of multiplier-accumulator processing circuits of the execution pipeline of the present inventions concurrently process each group of input data using associated group of filter weights. The plurality of multiplier-accumulator processing circuits of the execution pipeline may employ the circuitry, structures, architectures, function and operation of the multiplier-accumulator execution pipeline(s) implementing processing techniques are described and/or illustrated in U.S. Non-Provisional patent application Ser. No. 16/816,164, entitled "Multiplier-Accumulator Processing Pipelines and Processing Component, and Methods of Operating Same", filed Mar. 11, 2020, and/or U.S. Provisional Patent Application No. 62/831,413, entitled "Multiplier-Accumulator Circuitry and System having Processing Pipeline and Methods of Operating and Using Same", filed Apr. 9, 2019. In addition thereto, or in lieu thereof, the multiplier-accumulator circuitry of the present inventions may employ the circuitry, structures, architectures, function and operation of the multiplier-accumulator execution pipeline(s) implementing the non-Winograd processing techniques are described and/or illustrated in U.S. Non-Provisional patent application Ser. No. 16/796,111, entitled "Multiplier-Accumulator Circuitry having Processing Pipelines and Methods of Operating Same", filed Feb. 20, 2020 and/or U.S. Provisional Patent Application No. 62/823,161, entitled "Multiplier-Accumulator Circuitry having Processing Pipeline and Methods of Operating and Using Same", filed Mar. 25, 2019. The aforementioned four (4) patent applications are incorporated herein by reference.

In another embodiment, the execution pipeline (having the multiplier-accumulator processing circuits) concurrently processes a plurality of associated input data/values (e.g., sixteen input data/values wherein the associated input data/values may be arranged in, input into the processing circuitry and/or employed as a matrix (e.g., a 4×4) or block using Winograd processing techniques. In this regard, a plurality of associated filter coefficients or weights are also arranged in or employed by and/or input into the processing circuitry in groups (e.g., 16 filter coefficients in each group wherein each group may be arranged in and/or employed as a 4×4 matrix)) wherein each group of input data/values is processed, via Winograd processing techniques and circuitry, using a group of associated filter weights.

In one embodiment, in conjunction with Winograd data processing, the circuitry and techniques transform or convert input data/values, which may be stored in memory (e.g., layers consisting of two-dimensional arrays of image pixels), from an M×M matrix to an N×N matrix (where N and M are positive integers, and N is greater than M (e.g., M=3 and N=4)). The circuitry and techniques also transform or convert the filter weights, which may also be stored in memory in M×M blocks (e.g., layers consisting of two-dimensional arrays of filter weights or coefficients), from an M×M matrix to an N×N matrix or blocks of associated filter weights. Here, each M×M matrix or block of associated filter weights or coefficients is associated with an M×M matrix of associated input data/values. After the aforementioned conversions, the multiplier-accumulator circuitry processes the N×N input data using the associated N×N filter weights or coefficients via Winograd data processing techniques. In this regard, the plurality of multiplier-accumulator circuits of the execution pipeline may employ one or more of the Winograd processing techniques, circuitry, architectures, functions, processes, and/or operations described and/or illustrated in the '111 application, the '161 application, the '631 application and/or the '293 application identified above. As mentioned above, these four (4) applications are incorporated by reference herein.

Notably, in one embodiment, each filter coefficient or weight of a group of filter coefficients or weights includes a fraction field/value and an exponent field/value, and may also include a sign field/value. For example, a BSF data format may include a sign field/value (e.g., 1 bit), a fraction field/value (e.g., 6 bits) and an exponent field/value (e.g., 8 bit) wherein, after conversion, the exponent is common to the associated filter coefficients (e.g., the nine filter coefficients). In one embodiment, the filter coefficients, having a first data format, may be generated by a computer (e.g., host computer or processor) and stored in memory (e.g., L3 memory such as DRAM). The first data format may be an integer data format (e.g., 8 bit) or floating point data format (e.g., 16 bit). The second data format may be a block-scaled fraction ("BSF") data format including an exponent value. In one embodiment, a plurality of filter coefficients are associated and/or employed in groups (e.g., nine filter coefficients in a group wherein each group may be arranged and/or employed in a matrix (e.g., a 3×3 matrix)). Each filter coefficient or weight includes a fraction field/value and an exponent field/value and may include a sign field/value.

The circuitry of the present inventions may be disposed on or in integrated circuit(s), for example, a processor, controller, state machine, gate array, system-on-chip ("SOC"), programmable gate array ("PGA") and/or field programmable gate array ("FPGA") and/or a processor, controller, state machine and SOC including an embedded FPGA. An FPGA means both a discrete FPGA and an embedded FPGA. Alternatively, the circuitry of the present inventions may be disposed on or in integrated circuit(s) dedicated exclusively to such circuitry.

BRIEF DESCRIPTION OF THE DRAWINGS

The present inventions may be implemented in connection with embodiments illustrated in the drawings hereof.

These drawings show different aspects of the present inventions and, where appropriate, reference numerals, nomenclature, or names illustrating like circuits, architectures, structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

Notably, the configurations, block/data width, data path width, bandwidths, data lengths, values, processes, pseudo-code, operations, and/or algorithms described herein and/or illustrated in the FIGURES, and text associated therewith, are exemplary. Indeed, the inventions are not limited to any particular or exemplary circuit, logical, block, functional and/or physical diagrams, number of multiplier-accumulator circuits employed in an execution pipeline, number of execution pipelines employed in a particular processing configuration, organization/allocation of memory, block/data width, data path width, bandwidths, values, processes, pseudo-code, operations, and/or algorithms illustrated and/or described in accordance with, for example, the exemplary circuit, logical, block, functional and/or physical diagrams.

Moreover, although the illustrative/exemplary embodiments include a plurality of memories (e.g., L3 memory, L2 memory, L1 memory, L0 memory) which are assigned, allocated and/or used to store certain data and/or in certain organizations, one or more of memories may be added, and/or one or more memories may be omitted and/or combined/consolidated—for example, the L3 memory or L2 memory, and/or the organizations may be changed, supplemented and/or modified. The inventions are not limited to the illustrative/exemplary embodiments of the memory organization and/or allocation set forth in the application. Again, the inventions are not limited to the illustrative/exemplary embodiments set forth herein.

Figure 1A:
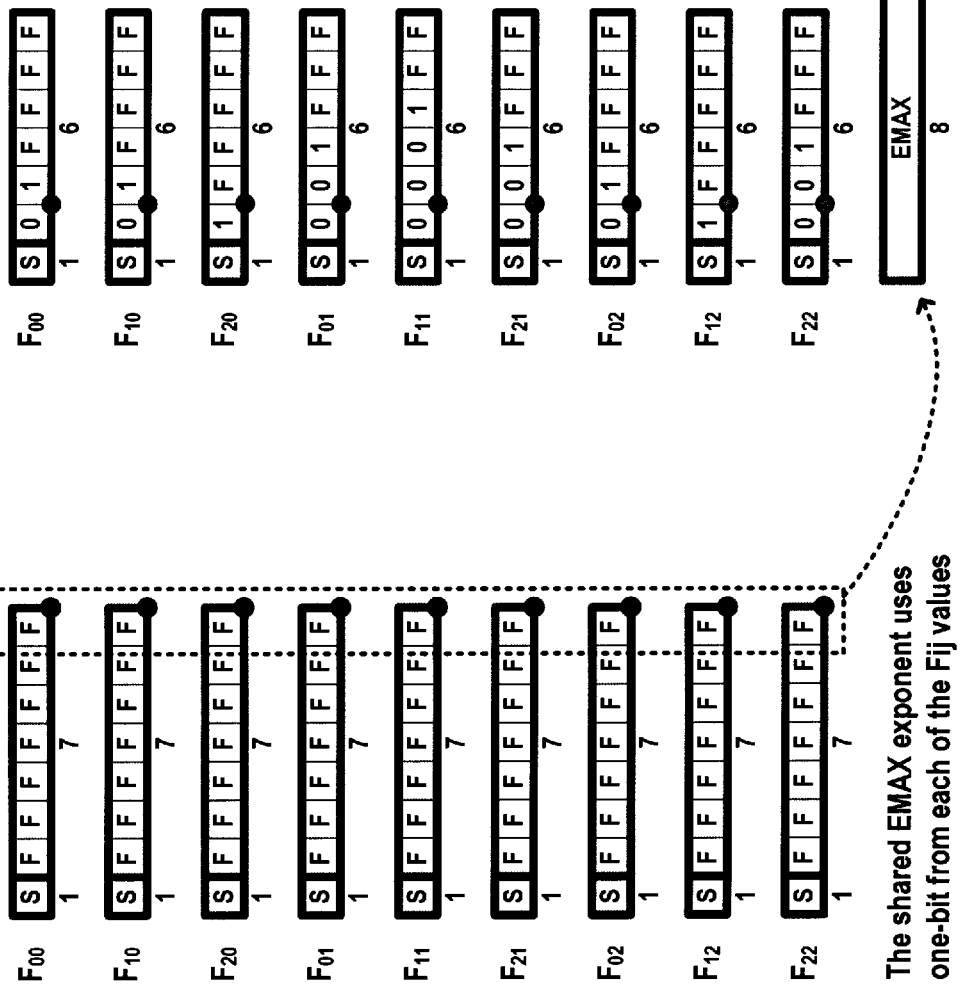
Figure 1B:
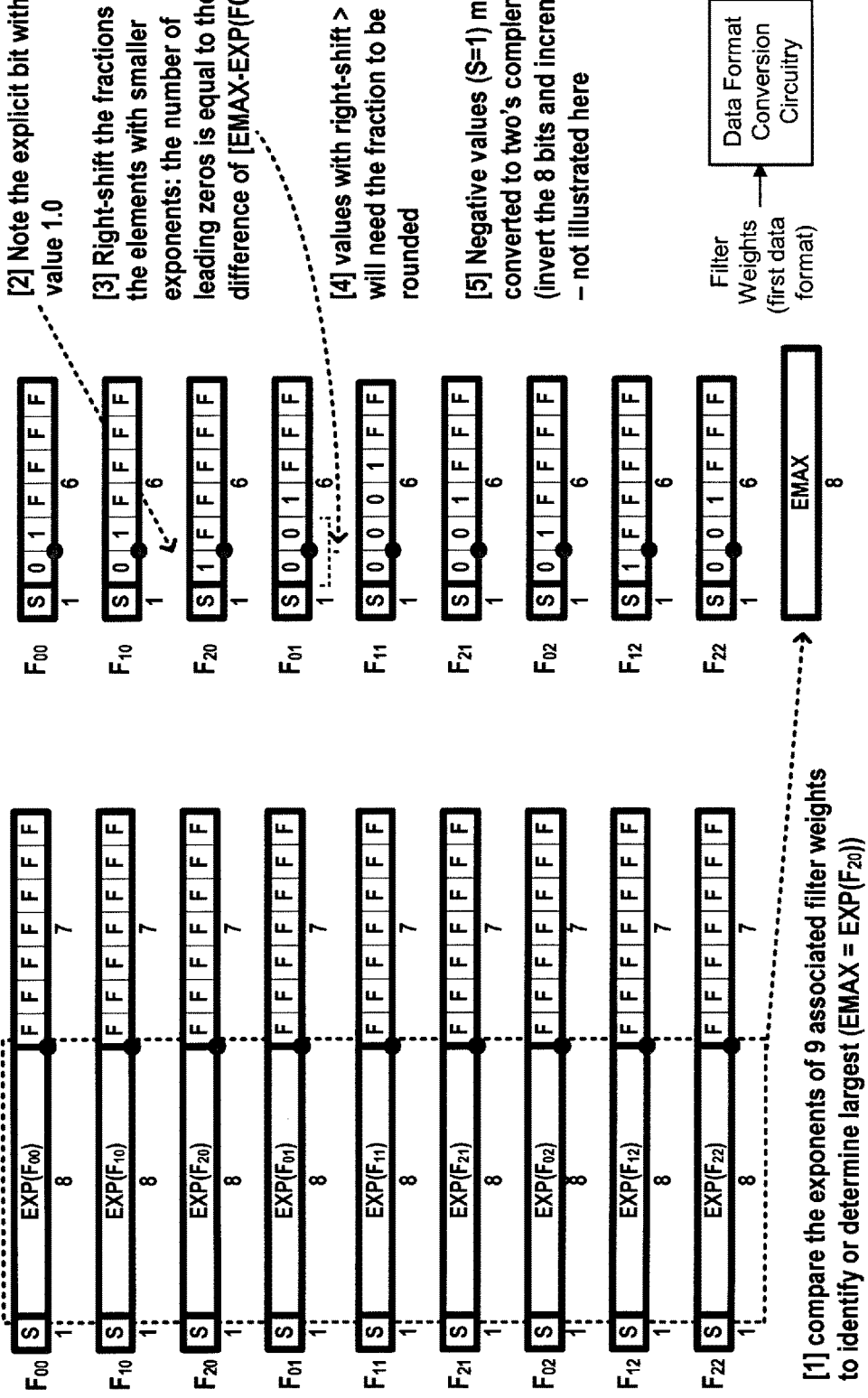
Figure 1D:
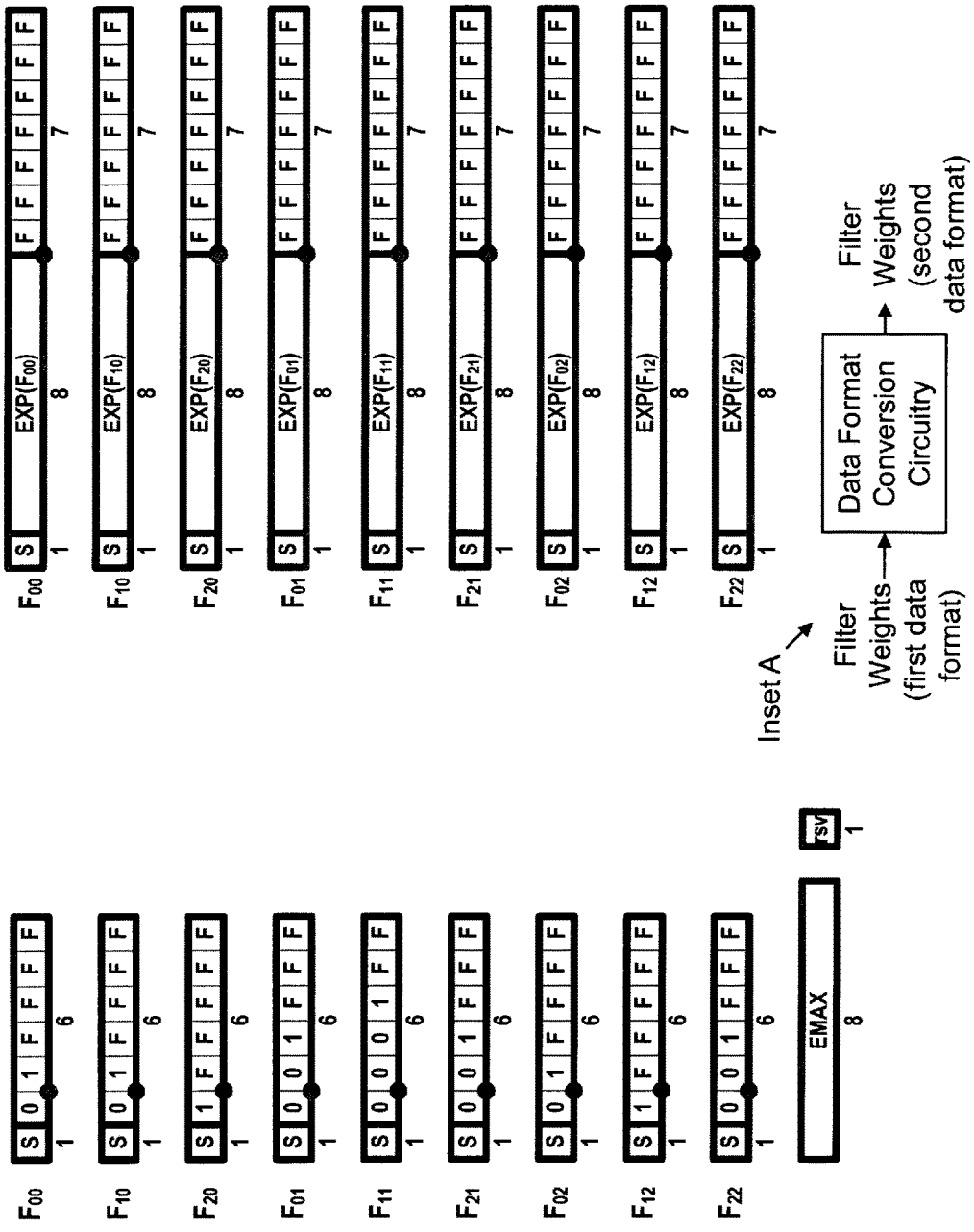
Figure 2A:
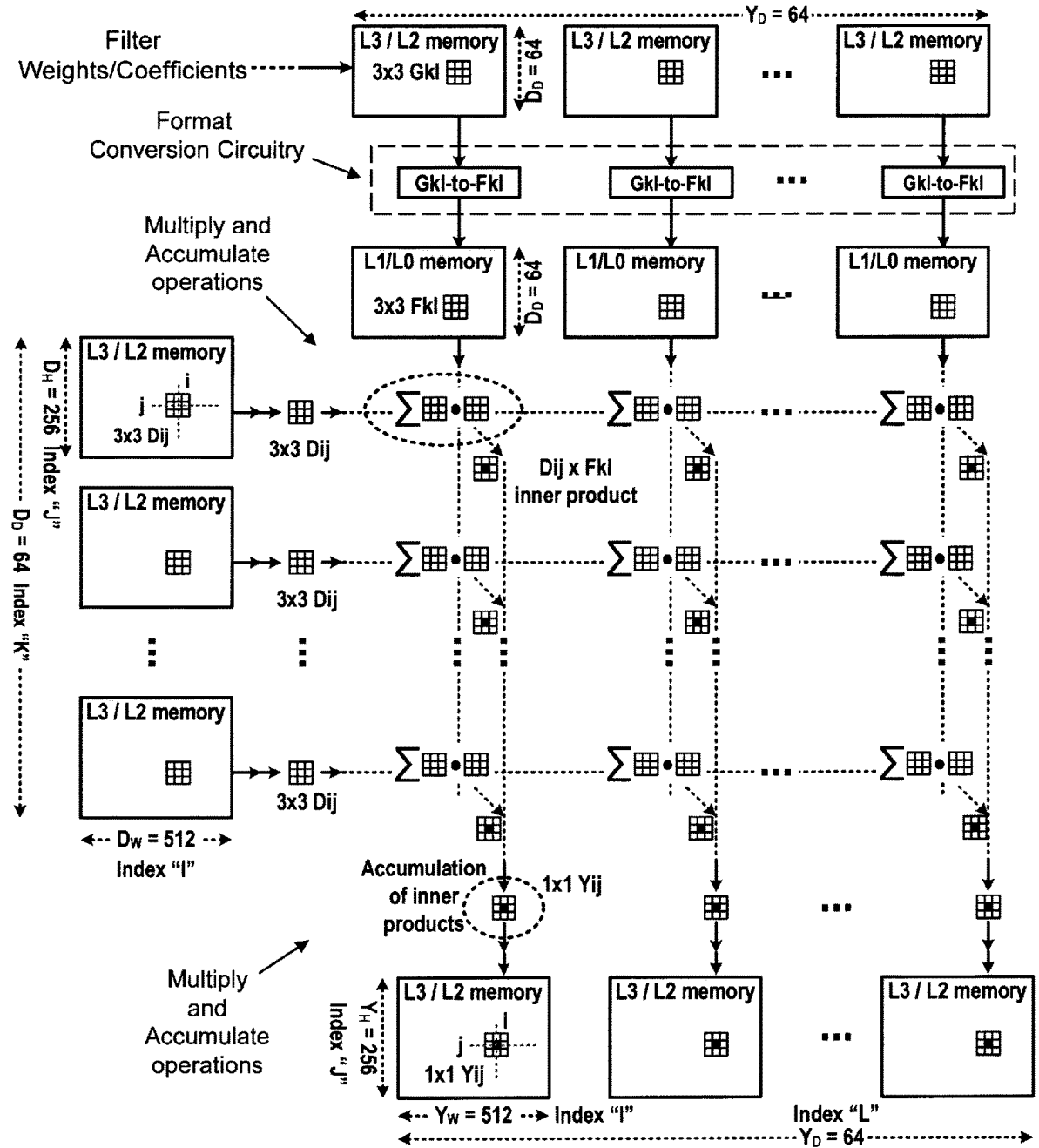
Figure 2C:
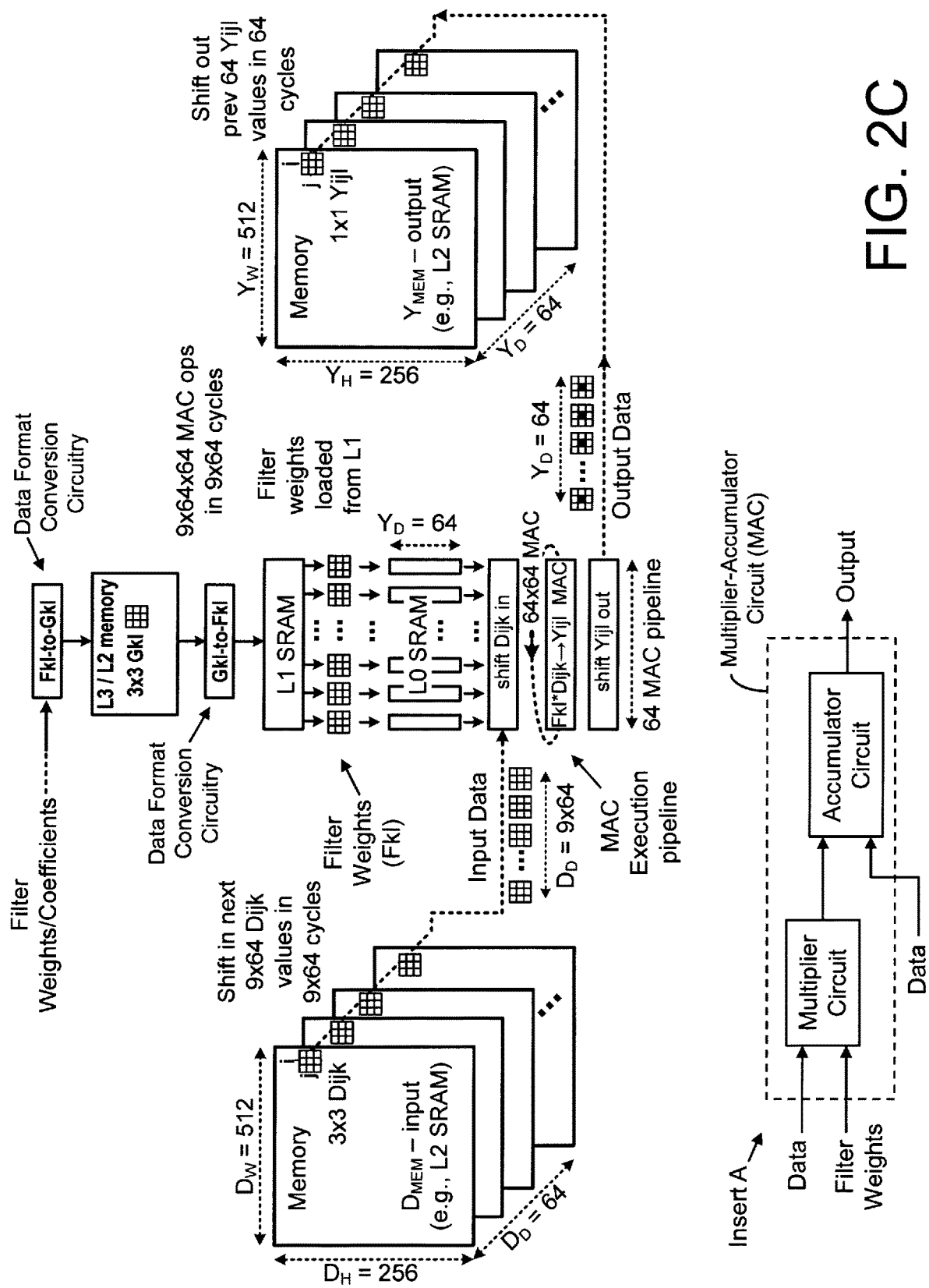
Figure 2D:
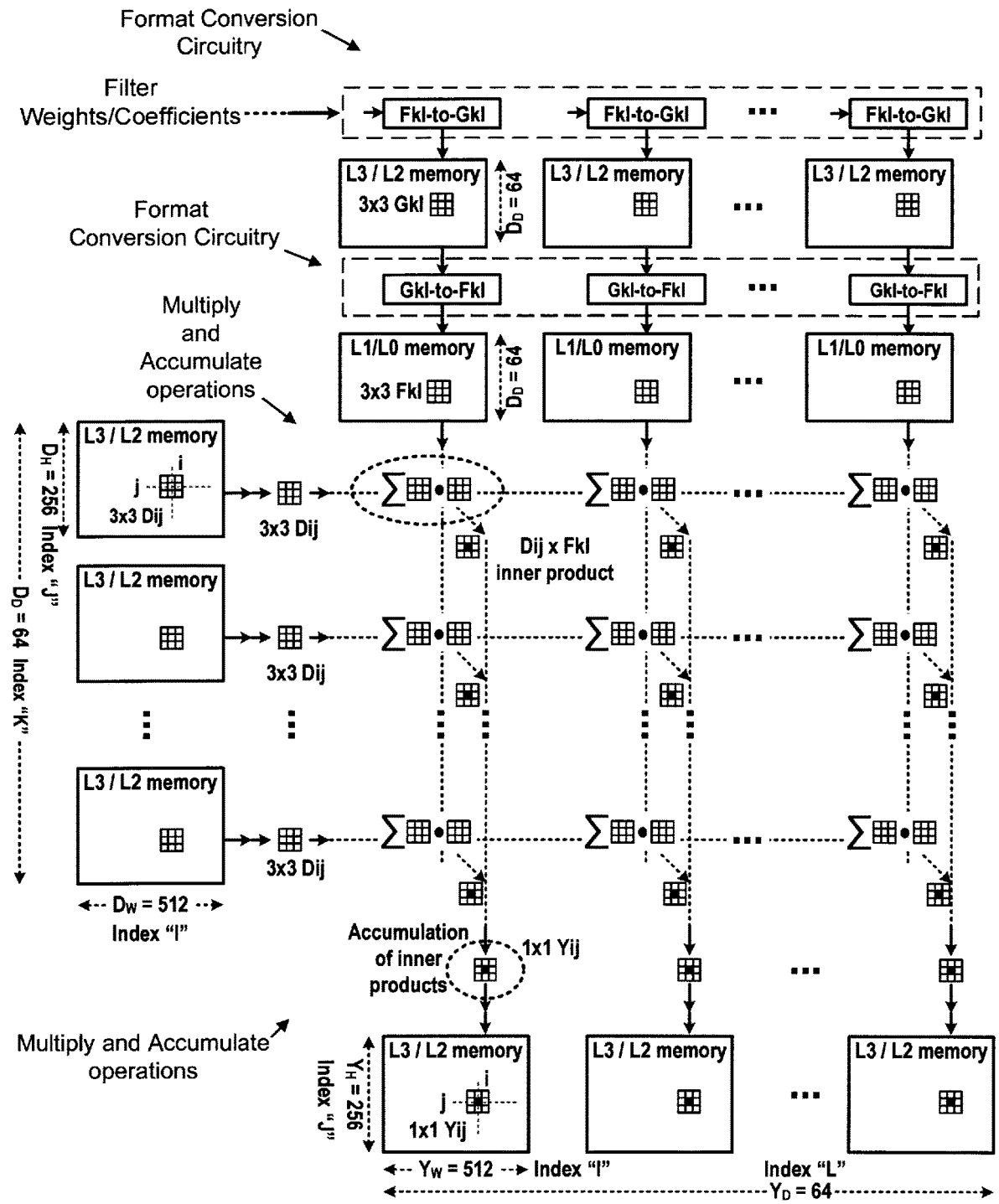
Figure 3A:
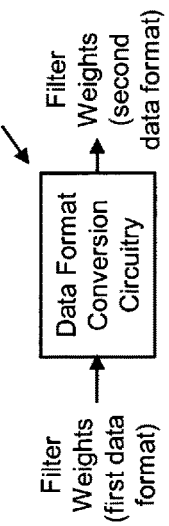
Figure 3B:
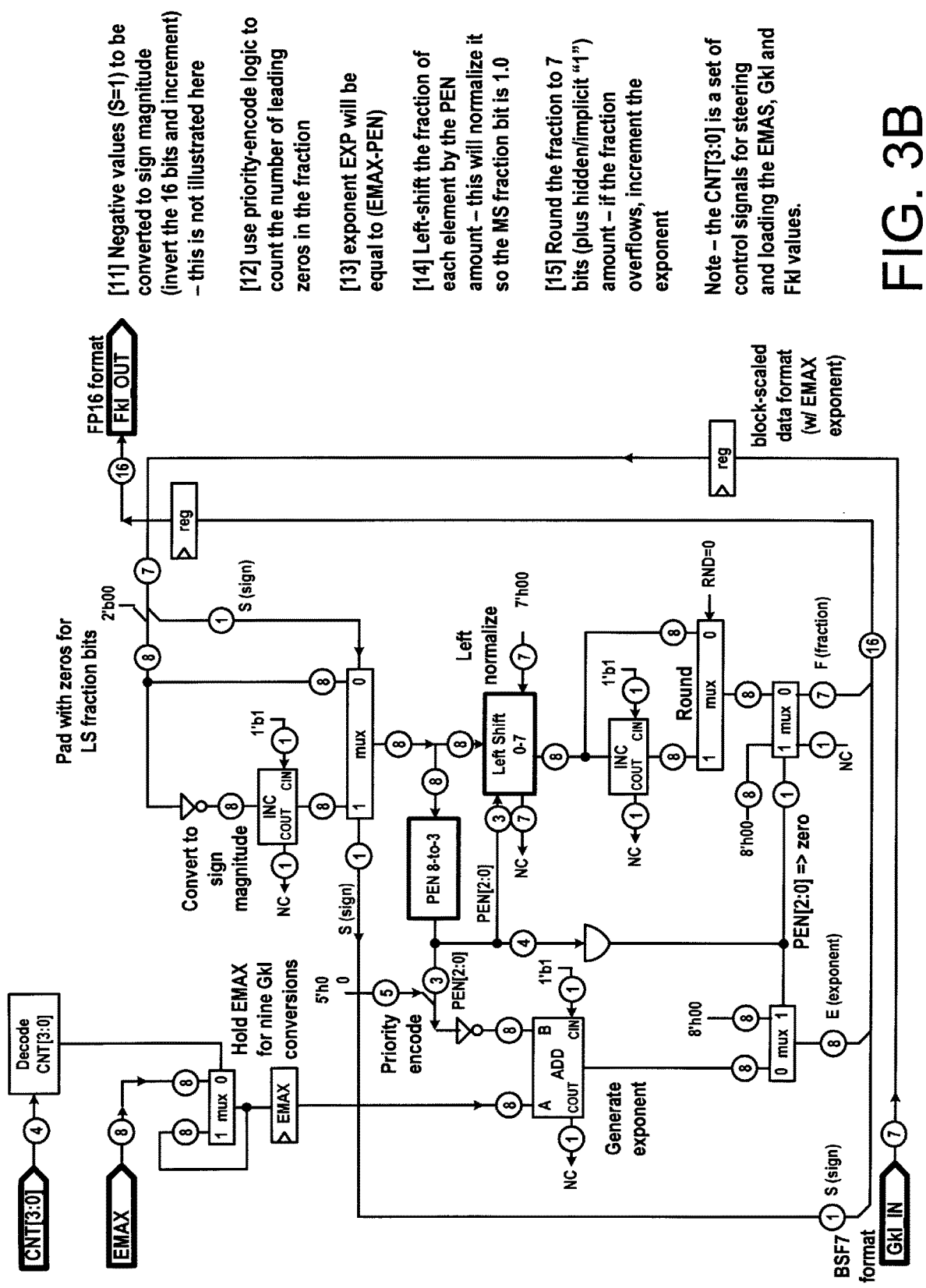
Figure 4A:
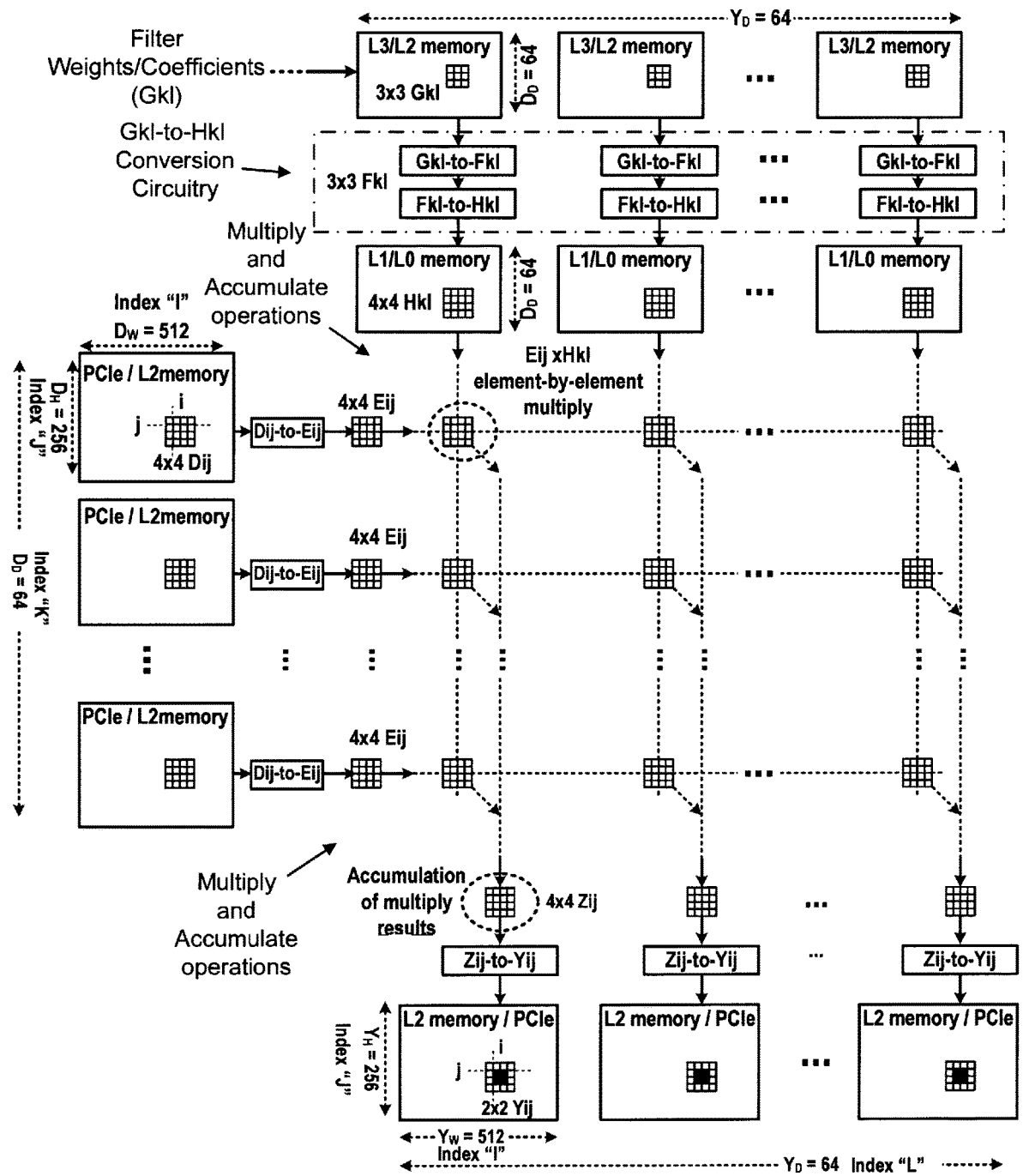
Figure 4C:
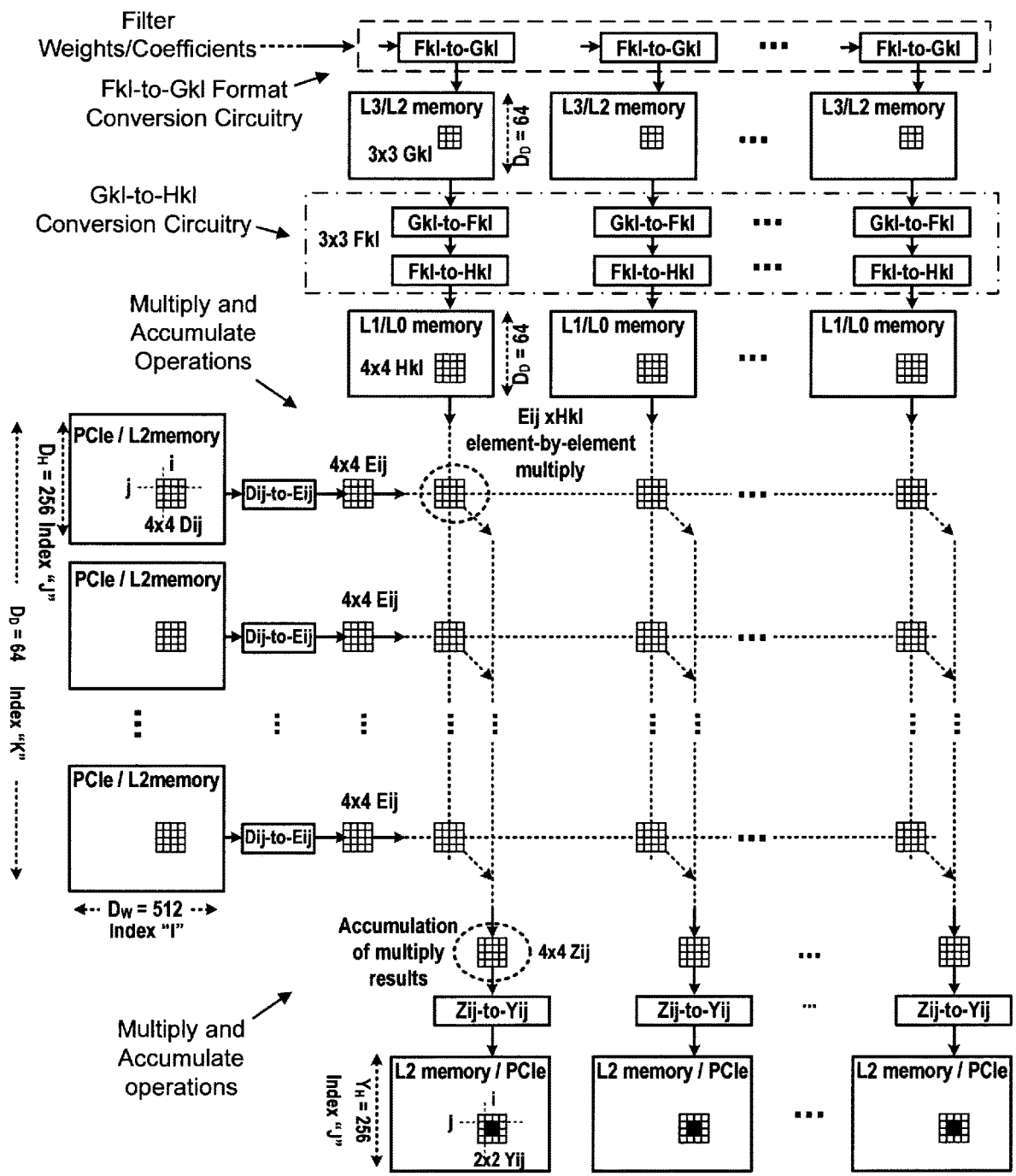
Figure 4D:
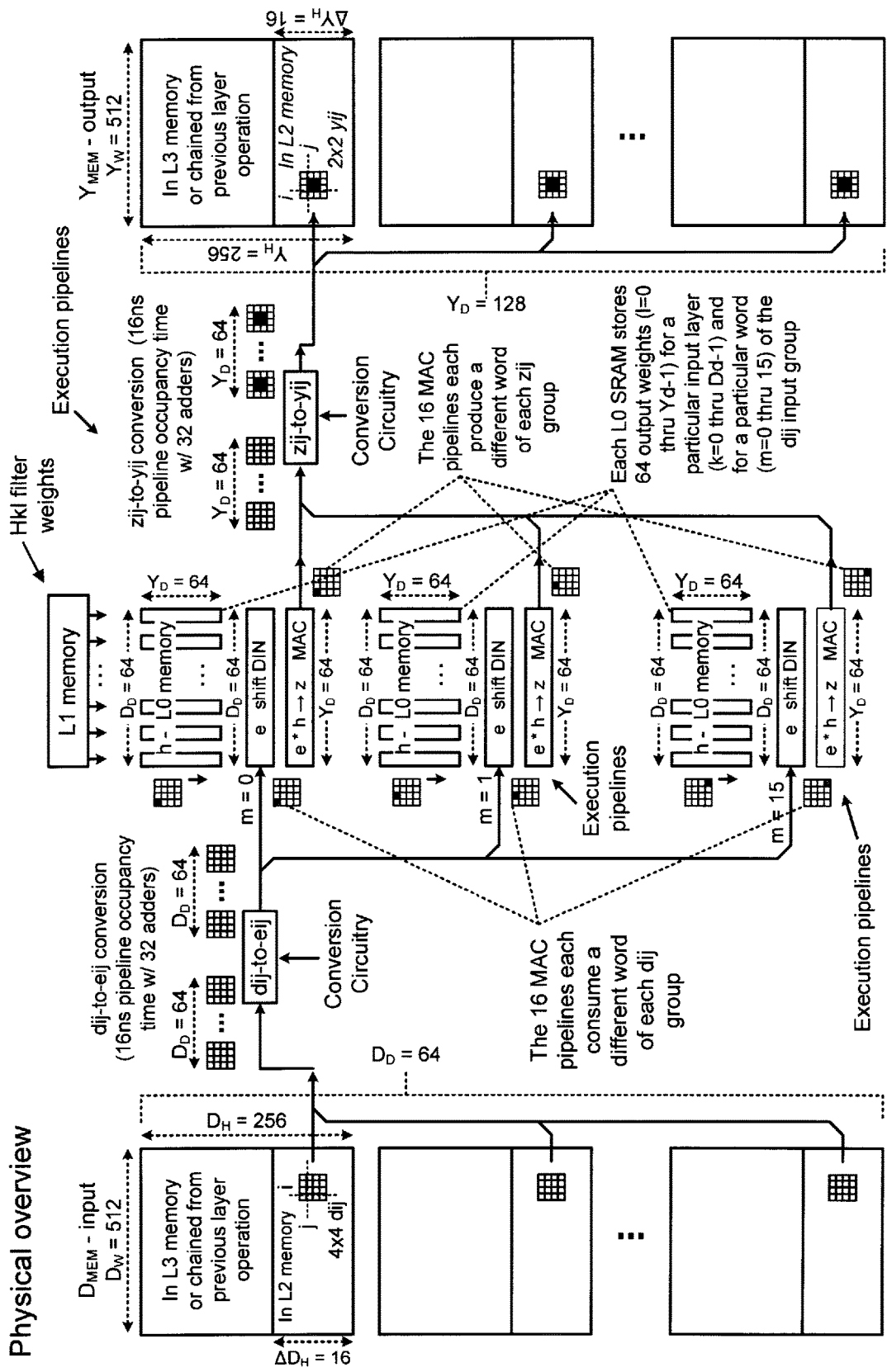
Figure 5:
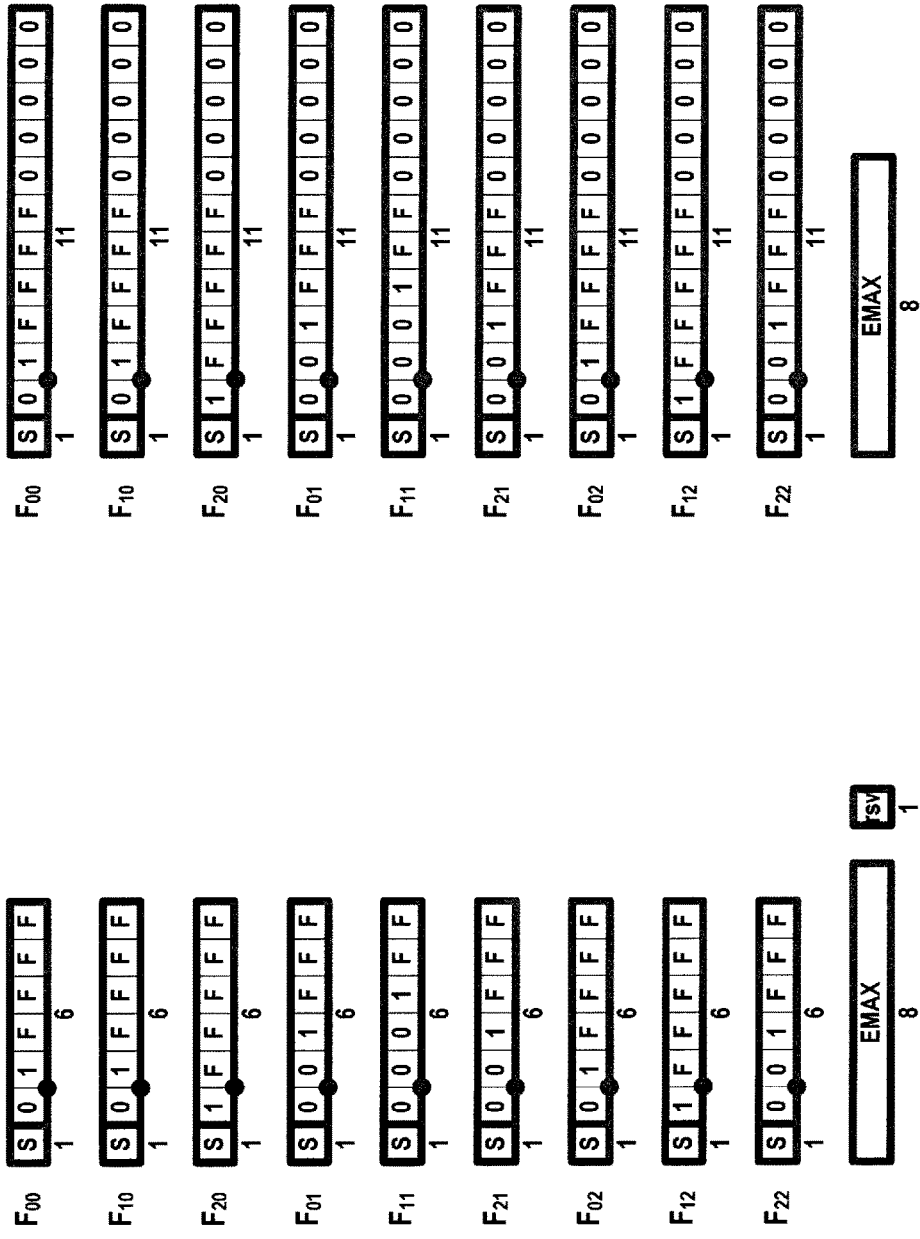
Figure 7A:
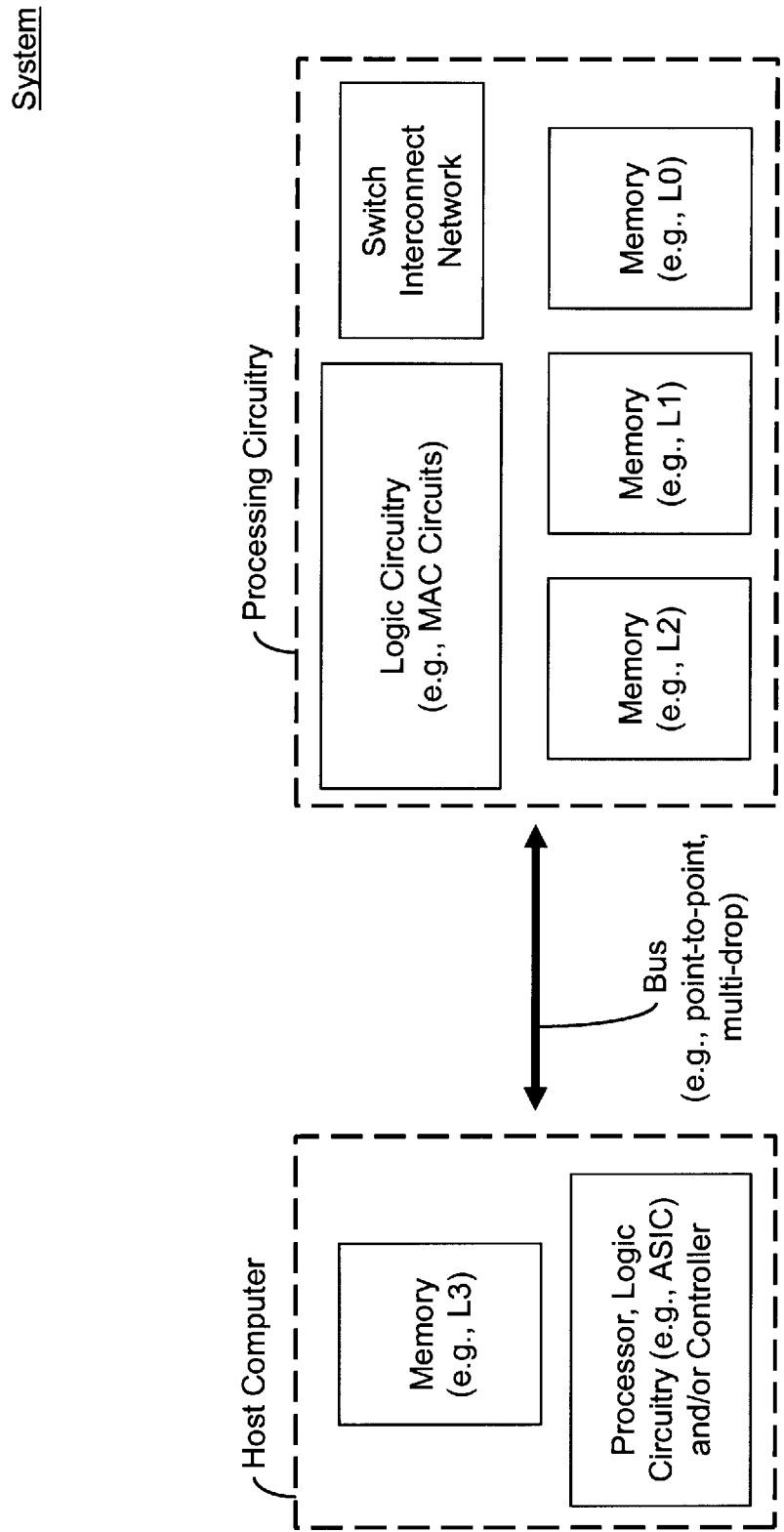
Figure 7B:
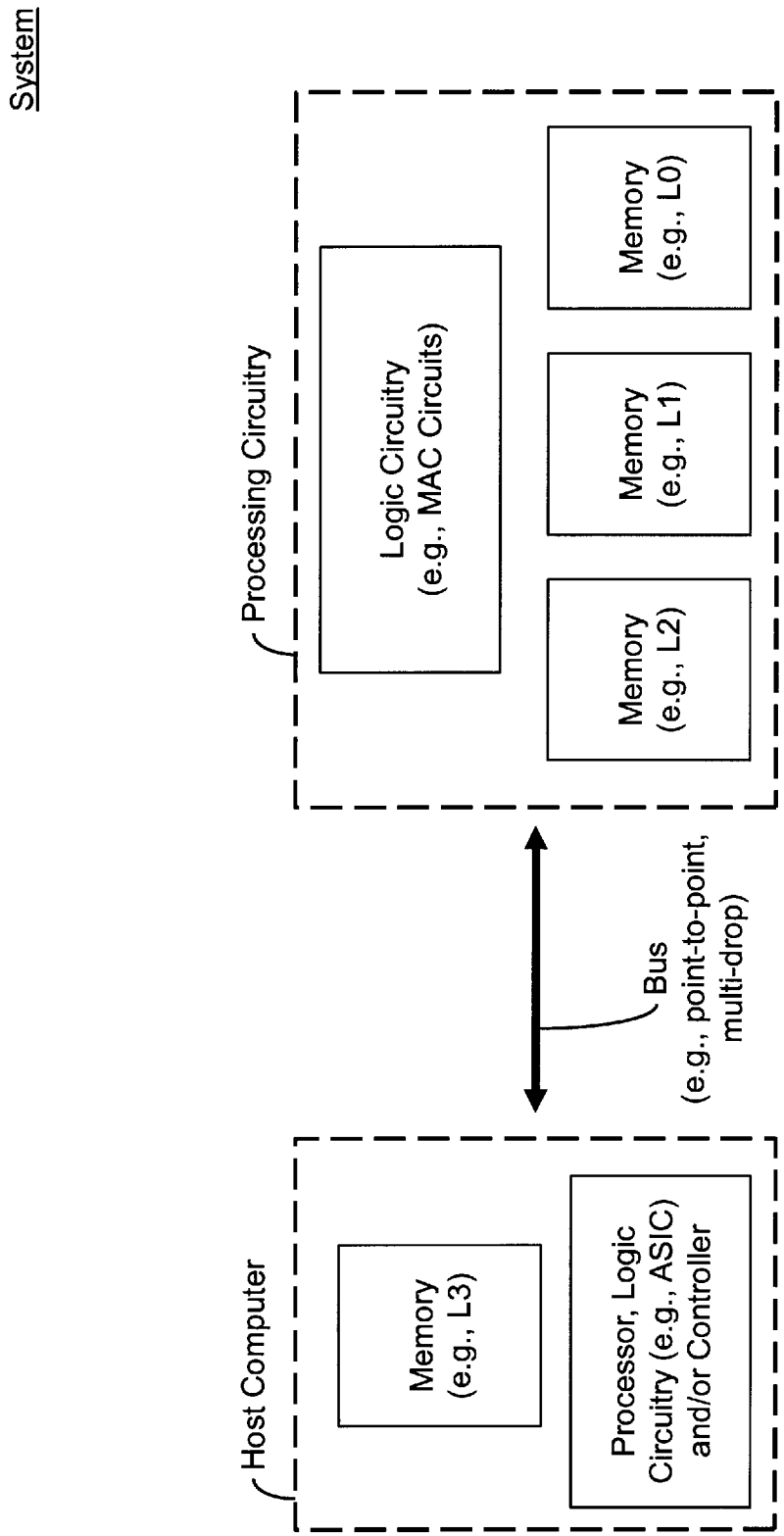
Figure 7C:
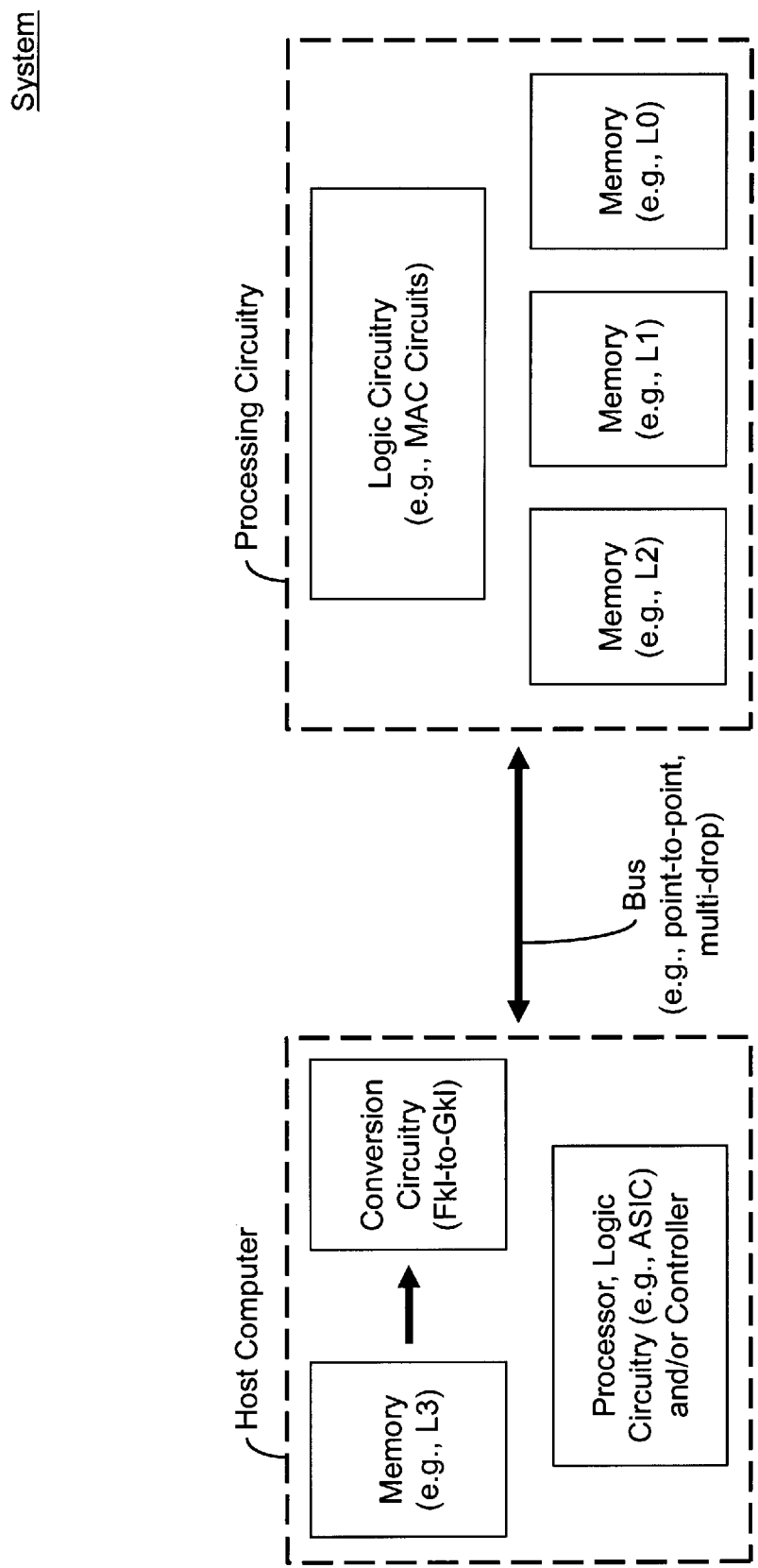
Figure 7D:
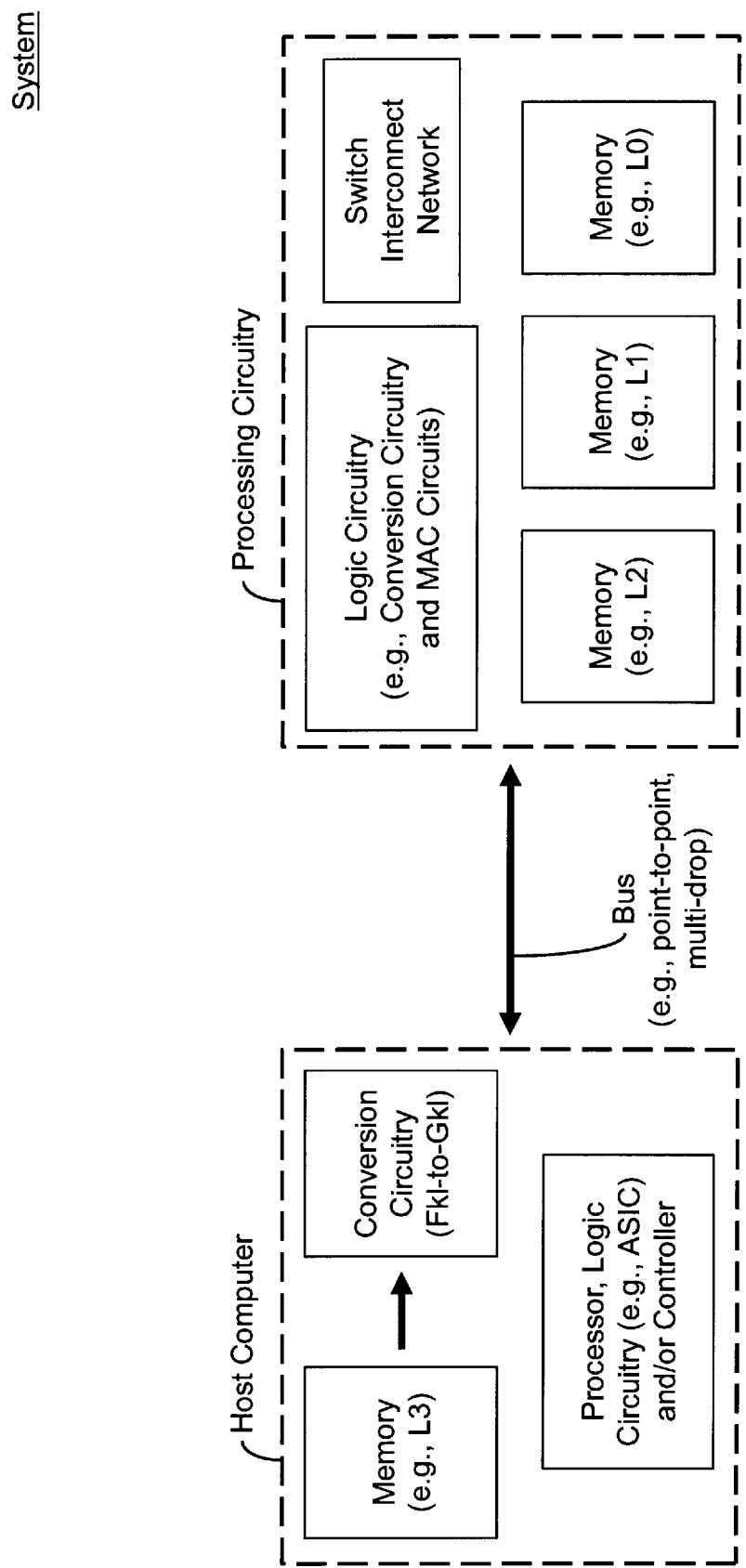
Figure 7E:
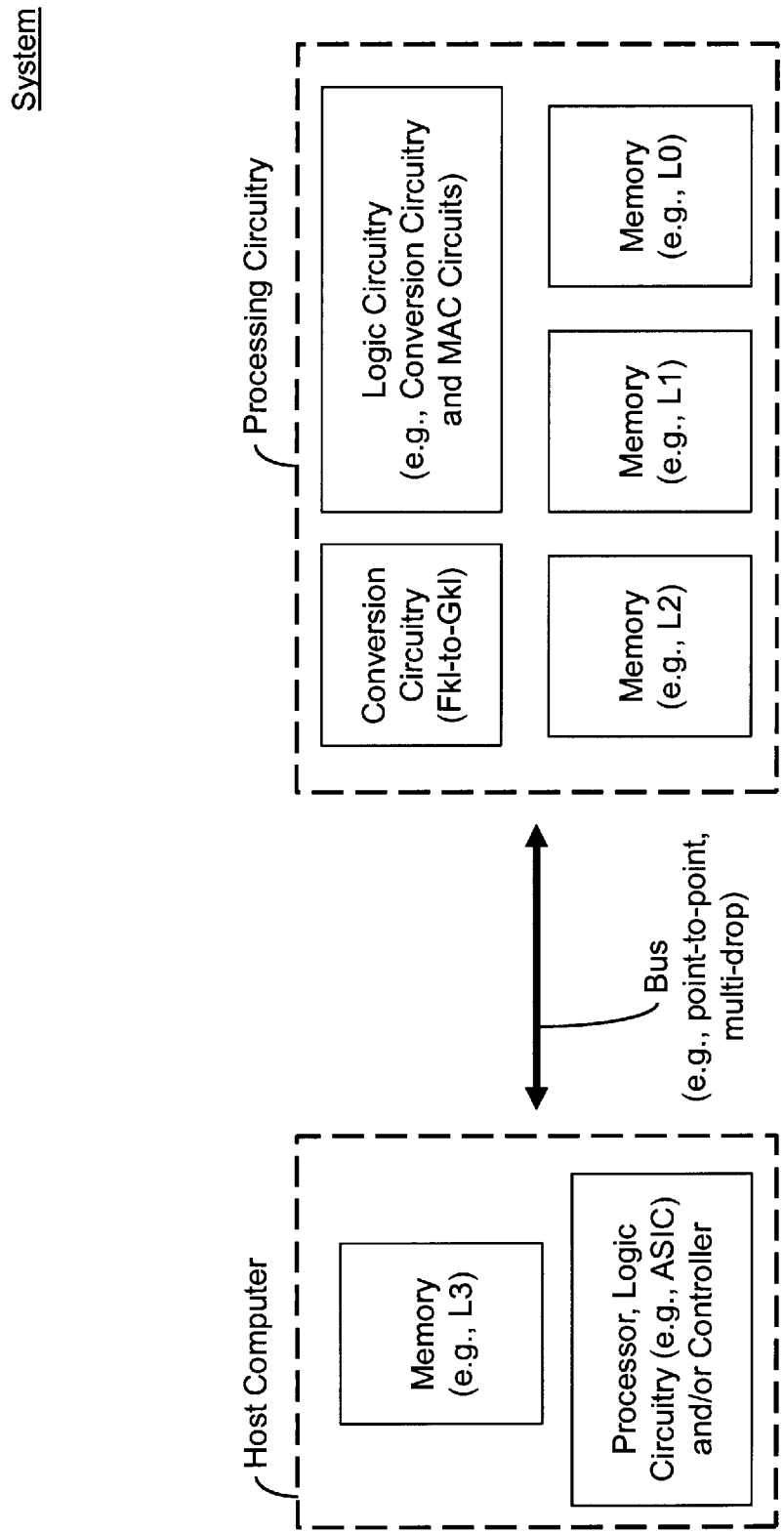
Figure 7F:
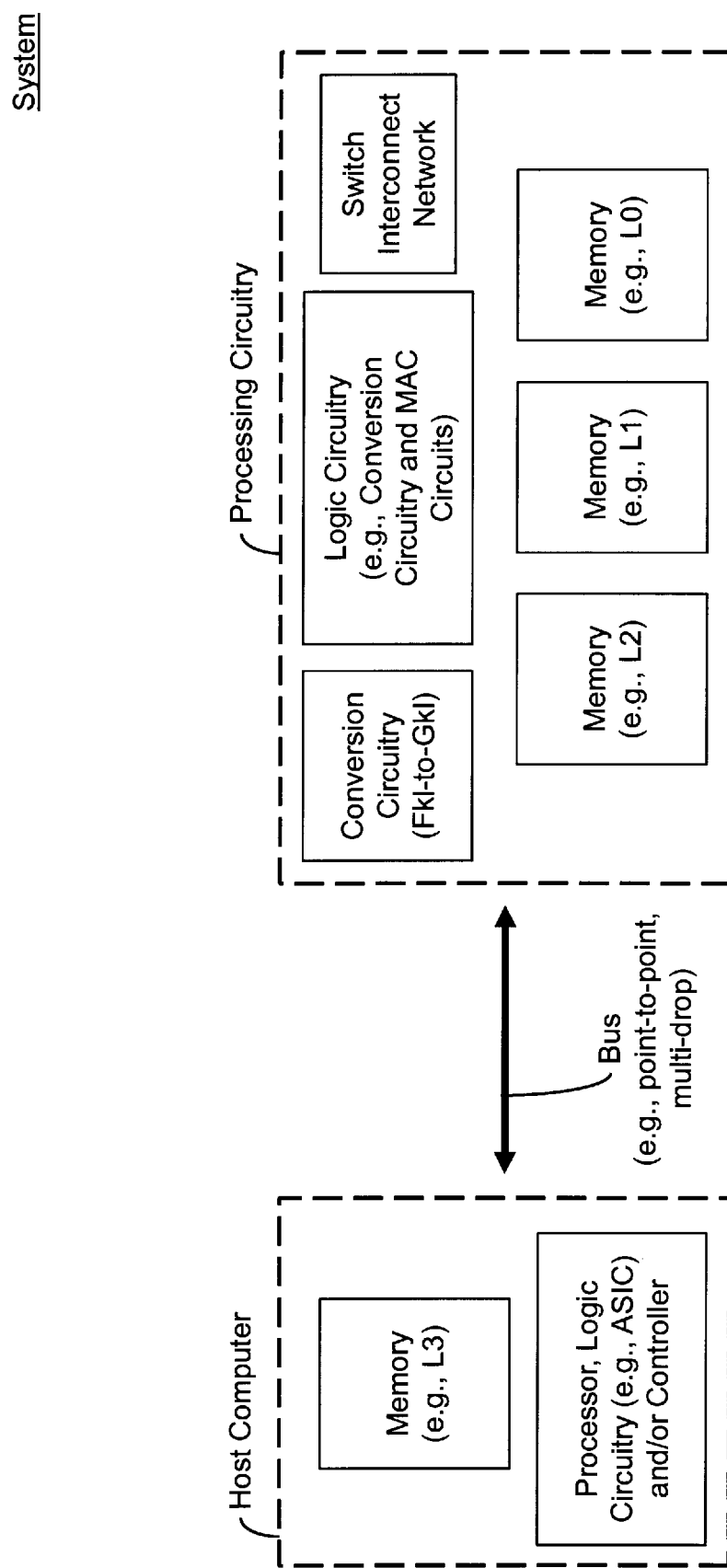

FIG. 1A illustrates an exemplary process of converting a group of associated filter coefficients or weights, having a first data format (e.g., integer data format ("INT")) to associated filter coefficients or weights, having a second data format (block-scaled fraction data format ("BSF")) and a common exponent field, wherein the second data format provides greater dynamic range without increasing or substantially increasing (within 10% of the total number of bits of the group of associated filter coefficients or weights, and preferably, within 5% of the total number of bits of the group of associated filter coefficients or weights) the allocation, usage or footprint of the filter coefficients or weights, having a second data format, in memory (L3 memory or L2 memory), according to aspects of the present inventions; notably, in this exemplary embodiment, the data format conversion circuitry (see Inset A) converts the group includes nine filter weights in an integer data format (eight bits in length in the illustrative embodiment) to nine filter weights in a block-scaled data format (seven bits in length in the illustrative embodiment) and, in addition, an exponent field (eight bits in length in the illustrative embodiment);

FIG. 1B illustrates another exemplary process of converting a group of associated filter coefficients or weights, having a first data format (e.g., floating point data format wherein each filter coefficient has a distinct/separate exponent field/value) to associated filter coefficients or weights, having a second data format (block-scaled fraction data format) and a exponent field which is common to the plurality of filter coefficients of the group, wherein the second provides greater dynamic range without increasing or substantially increasing (within 10% of the total number of bits of the group of associated filter coefficients or weights, and preferably, within 5% of the total number of bits of the group of associated filter coefficients or weights) the allocation, usage or footprint of the filter coefficients or weights, having a second data format, in memory (L3 memory or L2 memory), according to aspects of the present inventions; the exemplary process or operations of data format conversion circuitry to convert group of filter weights (nine in this illustrative embodiment) from a floating point data format (a floating point data format (FP) having 16 bits (FP16)) to a fixed point data format (in this illustrative embodiment, a BSF7 format in the illustrative embodiment) includes determining a largest exponent of the data/values (e.g., by comparing the exponents of each associated filter weights of the group of filter weights (e.g., on a rolling basis); in addition, a right shift of the fraction filed for each data/value with a smaller exponent and the fraction field of each data/value may be rounded (e.g., to comply with the BSF precision of the fraction field—which may be predetermined); in addition, the process may include a two's complement operation (invert the bits and increment) where the filter weight is a negative value;

FIG. 1C illustrates exemplary floating point data formats having different widths or lengths, including respective ranges, and exemplary integer data formats having different widths or lengths, including respective ranges;

FIG. 1D illustrates another exemplary process of converting a group of associated filter coefficients or weights, having a second data format (block-scaled fraction (BSF) data format) and a common exponent field to associated filter coefficients or weights having a third data format (floating point (FP) data format), wherein the third data format provides greater precision, according to aspects of the present inventions; notably, the plurality of associated filter weights of the group, having a third data format may be stored in memory (e.g., L1 memory (e.g., SRAM) and/or L0 memory (e.g., SRAM)) and/or provided to or input into the plurality of multiplier-accumulator circuits of the processing or execution pipeline which implement/perform the multiply and accumulate operations, in connection with input data (e.g., image data) in, for example, a floating point data format regime ((e.g., provided to or input directly from the data conversion circuitry or from memory (after the associated filter coefficients or weights having a third data format the stored therein);

FIG. 2A illustrates a schematic/flow block diagram of a logical overview of an exemplary embodiment of a plurality of multiplier-accumulator circuit (MAC) execution or processing pipelines wherein the data format of the filter weights or coefficients are converted to from a first data format to a second data format wherein, in one embodiment, the filter weights or coefficients in the second data format include an increase in dynamic range of the filter weights without increasing or substantially increasing (within 10% of the total number of bits of the group of associated filter coefficients or weights, and preferably, within 5% of the total number of bits of the group of associated filter weights) memory allocation, usage or footprint of the filter coefficients or weights, according to aspects of the present inventions; in this illustrative embodiment, the filter weights or coefficients having a first data format (e.g., a fixed point data format—such as BSF) are stored in memory L2 (e.g., SRAM) (which may have been loaded/written into memory L2 from memory L3 where such filter weights or coefficients were stored in and read from), applied to data format conversion circuitry to convert a plurality of groups of associated filter weights or coefficients, having the first data format (e.g., BSF or INT), to a plurality of groups of associated filter weights having a second data format (e.g., FP) which are then applied to or input into the plurality of multiplier-accumulator circuits of the execution pipelines which implement/perform the multiply and accumulate operations to process the input data (Dij, e.g., image data) in, for example, a floating point data format regime;

FIG. 2B illustrates an exemplary pseudo-code of the schematic block diagram of a logical overview of an exemplary embodiment of MAC processing pipelines illustrated in FIG. 2A;

FIG. 2C illustrates a schematic/flow block diagram of a logical overview of another exemplary embodiment of plurality of MAC execution or processing pipelines for processing input data (e.g., image data), which is read from memory and input into the pipelines, using filter weights having a data format that have been converted to increase the dynamic range of the filter weights without increasing or substantially increasing (within 10% of the total number of bits of the group of associated filter coefficients or weights, and preferably, within 5% of the total number of bits of the group of associated filter weights) the allocation, usage or footprint of the filter coefficients or weights, having a second data format, in memory (L3 memory or L2 memory), according to aspects of the present inventions; notably, in this exemplary embodiment, each multiplier-accumulator circuit execution pipeline includes a plurality of multiplier-accumulator circuits (see Inset A) implementing multiply and accumulate operations to process the input data using the aforementioned groups of filter weights or coefficients (M×M block of filter weights (e.g., a 3×3 block of filter weights)), according to certain aspects of the present inventions;

FIG. 2D illustrates a schematic/flow block diagram of a logical overview of an exemplary embodiment of a plurality of multiplier-accumulator circuit (MAC) execution or processing pipelines wherein the data format of the filter weights or coefficients are converted to increase the dynamic range of the filter weights without increasing or substantially increasing (within 10% of the total number of bits of the group of associated filter coefficients or weights, and preferably, within 5% of the total number of bits of the group of associated filter weights) the allocation, usage or footprint of the filter coefficients or weights, having a second data format, in memory (L3 memory or L2 memory), according to aspects of the present inventions; in this illustrative embodiment, the filter weights or coefficients having a first data format (e.g., a fixed point data format—such as INT) are input (e.g., from a processor (e.g., an external processor) and/or a computer (e.g., a host computer)) into data format conversion circuitry (i.e., Fkl-to-Gkl format conversion circuitry) wherein a plurality of groups of associated filter weights or coefficients, having the first data format (e.g., INT), are converted to a plurality of groups of associated filter weights having a second data format (e.g., BSF—see, e.g., FIG. 1A) and thereafter stored in memory (L3 memory (e.g., DRAM) and/or L2 memory (e.g., SRAM)); the plurality of groups of associated filter weights having a second data format (e.g., BSF) are then read from memory into additional data format conversion circuitry (i.e., Gkl-to-Fkl format conversion circuitry) which converts the filter weights of the plurality of groups of associated filter weights to a third data format (e.g., FP—see, e.g., FIG. 1D) and, in this illustrative embodiment, thereafter stored in memory (L1 memory and/or L0 memory (e.g., SRAM)); the plurality of groups of associated filter weights, having the third data format, are available to the MAC processing pipelines for processing of the input data (Dij, e.g., image data); here, each filter weight of the plurality of groups of associated filter weights having a third data format (e.g., FP—see, e.g., FIG. 1D) is applied to or input into the plurality of multiplier-accumulator circuits of the MAC execution pipelines which implement/perform the multiply and accumulate operations to process the input data (Dij, e.g., image data) in, for example, a floating point data format regime; notably, each MAC pipeline includes a plurality of multiplier-accumulator circuits (an exemplary multiplier-accumulator circuit is illustrated in schematic block diagram form in Inset A in FIG. 2C) which are, for example, serially connected to facilitate concatenating the multiply and accumulate operations (see, e.g., the exemplary embodiments illustrated in, for example, FIGS. 1A-1C and 12 of U.S. patent application Ser. No. 16/545,345); the '345 application is hereby incorporated by reference in its entirety;

FIG. 3A illustrates exemplary process of format conversion circuitry conversion circuitry (e.g., the Gkl-to-Fkl conversion circuitry—see, e.g., FIGS. 2A, 2C and 2D) to convert groups of associated filter coefficients or weights, having a second data format (block-scaled fraction data format) to associated filter coefficients or weights, having a third data format (floating point data format), wherein the third data format provides greater precision and is in a floating point data format which is suitable for use in processing pipelines having circuitry that implement floating point multiply and accumulate operations, according to aspects of the present inventions; the exemplary process or operations of data format conversion circuitry to convert group of filter weights (nine in this illustrative embodiment) from fixed point data format (in this illustrative embodiment, a BSF7 format in the illustrative embodiment) to a floating point data format (a floating point data format (FP) having 16 bits (FP16)) includes, assessing whether the sign-fraction field of the filter weight is negative, wherein if it is negative, the fraction field is inverted and incremented (if value in the BSF format is in two's complement format—however, if the value is in sign-magnitude format, this process may be omitted); the number of leading zeros in the fraction field is counted (PEN value) wherein the PEN value is used to adjust the exponent field in the filter weight and used to left shift the fraction field of the filter weight so that it is normalized (with an MS fraction bit set to one—the bit in this bit position will be omitted (hidden/implicit bit) the filter weight in the third data format (FP16); in addition, fraction field of the filter weight in the third data format (FP16) is rounded to seven bits (plus the hidden bit) and, if there is mantissa overflow, the exponent field will be incremented accordingly; notably, the plurality of associated filter weights of the group, having a FP data format may be applied to or input into the plurality of multiplier-accumulator circuits of the MAC processing or execution pipeline which implement/perform the multiply and accumulate operations, in connection with input data (e.g., image data) in, for example, a floating point data format regime FIG. 3B illustrates an exemplary schematic/circuit block diagram of the exemplary format conversion circuitry conversion circuitry (e.g., the Gkl-to-Fkl conversion circuitry—see FIGS. 2A, 2C and 2D) to convert the associated filter weights, in a fixed point data format (a BSF7 format in the illustrative embodiment) to associated filter weights in a floating point data format (an FP16 format in the illustrative embodiment), according to the exemplary process of FIG. 3A, in accordance with an embodiment of the present inventions; the circuit block diagram illustrated in FIG. 3B provides details of the format conversion circuitry of the logical block diagram illustrated in FIGS. 2A, 2C and 2D employed to convert the filter weights or coefficients having a BSF data format to filter weights having a floating point data format) as well as circuit implementation of the processes illustrated in FIG. 3A, according to one embodiment of the present inventions; notably, the plurality of associated filter weights (in the illustrative embodiment, nine associated filter weights) of each group of filter weights, having a floating point data format may be input into the plurality of multiplier-accumulator circuits, implementing operations in a floating point data format, of the MAC execution pipelines;

FIG. 4A illustrates a schematic/flow block diagram of a logical overview of an exemplary embodiment of a plurality of multiplier-accumulator circuit (MAC) execution or processing pipelines wherein the data format of the filter weights or coefficients are converted to increase the dynamic range of the filter weights without increasing or substantially increasing (within 10% of the total number of bits of the group of associated filter coefficients or weights, and preferably, within 5% of the total number of bits of the group of associated filter weights) the allocation, usage or footprint of the filter coefficients or weights, having a second data format, in memory (L3 memory or L2 memory), according to aspects of the present inventions; in this illustrative embodiment, the filter weights or coefficients having a first data format (e.g., a fixed point data format—such as INT) are converted to a second data format (BSF) and stored in memory L2 (e.g., SRAM); the plurality of associated filter weights of each group (each filter weight thereof having the second data format) is applied to data format conversion circuitry to convert a plurality of associated filter weights to a plurality of associated filter weights (Hkl) having a data format which is the same as the second data format and an increased width, length or size (e.g., from BSF7 to BSF12) are further processed or converted, using Winograd conversion circuitry to a Winograd format (Hkl), as sixteen filter weights arranged as a matrix (e.g., a 4×4) or block; in this illustrative embodiment, a plurality of filter coefficients or weights are also associated, arranged in or employed by and/or input into the processing circuitry in groups (e.g., 16 filter coefficients in each group wherein each group may be arranged in and/or employed as a 4×4 matrix); the filter weights, in a Winograd format, are then available to or input into the plurality of multiplier-accumulator circuits of the execution pipelines which implement/perform the multiply and accumulate operations to process the input data (Dij, e.g., image data) which are also converted to a Winograd format (Eij) via Winograd conversion circuitry; in this exemplary embodiment, multiplier-accumulator circuitry implement Winograd processing techniques, to process the image data, as described and/or illustrated (as mentioned above) in the '111 application, the '161 application, the '631 application and/or the '293 application; notably, the Hkl filter coefficients (which have the second data format and increased width, length or size may be stored in memory (e.g., L1 memory or L0 memory—such as SRAM) and thereafter input into the plurality of multiplier-accumulator circuits of the execution pipelines implementing Winograd processing techniques; moreover, the Winograd conversion circuitry may employ the circuitry and techniques described and/or illustrated in the '111 application, the '161 application, the '631 application and/or the '293 application;

FIG. 4B illustrates an exemplary pseudo-code of the schematic block diagram of a logical overview of an exemplary embodiment of MAC processing pipelines illustrated in FIG. 4A;

FIG. 4C illustrates a schematic/flow block diagram of a logical overview of an exemplary embodiment of a plurality of multiplier-accumulator circuit (MAC) execution or processing pipelines wherein the data format of the filter weights or coefficients are converted to increase the dynamic range of the filter weights without increasing or substantially increasing (within 10% of the total number of bits of the group of associated filter coefficients or weights, and preferably, within 5% of the total number of bits of the group of associated filter weights) the allocation, usage or footprint of the filter coefficients or weights, having a second data format, in memory (L3 memory or L2 memory), according to aspects of the present inventions; in this illustrative embodiment, the filter weights or coefficients having a first data format (e.g., a fixed point data format—such as INT) are input (e.g., from a processor (e.g., an external processor) and/or a computer (e.g., a host computer) into data format conversion circuitry (i.e., Fkl-to-Gkl format conversion circuitry) wherein a plurality of groups of associated filter weights or coefficients, having the first data format (e.g., INT), are converted to a plurality of groups of associated filter weights having a second data format (e.g., BSF) and thereafter stored in memory (L3 memory (e.g., DRAM) and/or L2 memory (e.g., SRAM)); the plurality of groups of associated filter weights having a second data format (e.g., BSF) are then read from memory into additional data format conversion circuitry (i.e., Gkl-to-Hkl format conversion circuitry) to process a plurality of associated filter weights to a plurality of associated filter weights having a data format which is the same as the second data format and an increased width, length or size (e.g., from BSF7 to BSF12) and the associated filter weights (M×M, e.g., 3×3) and converted, using Winograd conversion circuitry, to a filter weights (Hkl) in a Winograd format, which, in the illustrative embodiment, is sixteen filter weights arranged as a matrix (N×N, e.g., a 4×4) or block; in this illustrative embodiment, a plurality of filter coefficients or weights are also associated, arranged in or employed by and/or input into the processing circuitry in groups (e.g., 16 filter coefficients in each group wherein each group may be arranged in and/or employed as a 4×4 matrix); the filter weights, in a Winograd format, are then read from memory and input into the plurality of multiplier-accumulator circuits of the execution pipelines which implement/perform the multiply and accumulate operations to process the input data (Eij); here, the input data (Dij, e.g., image data) are converted to a Winograd format (Eij) via Winograd conversion circuitry; in this exemplary embodiment, multiplier-accumulator circuitry implement Winograd processing techniques, to process the image data, as described and/or illustrated (as mentioned above) in the '111 application, the '161 application, the '631 application and/or the '293 application; notably, the Hkl filter coefficients, in one embodiment, may have the second data format and increased width, length or size may be stored in memory (e.g., L1 memory or L0 memory—such as SRAM) or, in another embodiment, may have a floating point data format; thereafter the filter weights (Hkl), in a Winograd format, are input into the plurality of multiplier-accumulator circuits of the execution pipelines implementing Winograd processing techniques; moreover, the Winograd conversion circuitry may employ the circuitry and techniques described and/or illustrated in the '111 application, the '161 application, the '631 application and/or the '293 application;

FIG. 4D is a schematic block diagram of a physical overview of an exemplary embodiment of a plurality of multiplier-accumulator execution pipelines, according to certain aspects of the present inventions, wherein the plurality of multiplier-accumulator execution pipelines are configured to implement a Winograd technique of data processing, according to certain aspects of the present inventions; notably, in this example, the 64×(4×4) input pixels/data at dij are converted to a Winograd format via Winograd conversion circuitry (dij-to-eij), which determine the associated 64×(2×2) output pixels at yij, are processed by a plurality (here, 16) of multiplier-accumulator execution pipelines; in this illustrative embodiment, L1 memory stores the plurality of filter coefficients or weights are also associated, arranged in or employed by and/or input into the processing circuitry in groups (e.g., 16 filter coefficients in each group wherein each group may be arranged in and/or employed as a 4×4 matrix or block); in this embodiment, the filter weights, in a Winograd format, are read from memory and input into a plurality of multiplier-accumulator circuits of the execution pipelines which implement/perform multiply and accumulate operations to process the input data (Eij);

FIG. 5 illustrates an exemplary process of increasing the width, length or size of each filter weight of a group of associated filter weights, having a fixed point data format (e.g., block-fraction scaled data format ("BSF")), according to aspects of the present inventions; this exemplary process may be implemented in the Gkl-to-Fkl conversion circuitry of the Gkl-to-Hkl conversion circuitry illustrated in FIGS. 4A and 4C; in one embodiment, the width, length or size of each filter weight of the group of associated filter weights, which are in a BSF data format having a common exponent field, are is increased from seven bits (i.e., BSF7) to 12 bits (BSF12); notably, the plurality of groups of associated filter weights having a BSF12 data format may be input into Winograd conversion circuitry (Fkl-to-Hkl) of the Gkl-to-Hkl format conversion circuitry (see, e.g., FIGS. 4A and 4C) to convert a plurality of associated filter weights to a plurality (here, 16) of associated filter weights (Hkl) filter weights arranged as a matrix (4×4) or block which, in one embodiment, may be stored in L1 memory and/or L0 memory and subsequently read therefrom and input into the plurality of multiplier-accumulator circuits of the execution pipelines which implement/perform the multiply and accumulate operations to process the input data (Eij);

FIG. 6 illustrates an exemplary process of employing the extra field bit "rsv" to extend the exponent field of the filter coefficients of the BSF data format, according to certain aspects of the present inventions; wherein when the extra bit RSV=0, the original data format is used and when the extra bit RSV=1, two bits of the fraction field are used as an exponent offset value; wherein when two bits of the fraction field are used as an exponent offset value, the exponent offset is subtracted from E MAX to generate the exponent field for each of the nine values and thereby enhance the uniformity level of precision across the nine values; notably, the choice between the two different data formats may be made for each block or group of filter weights (e.g., depending upon the size distribution across the nine (3×3) weight values) and may be employed in any of the embodiments described and/or illustrated herein (for example, the embodiments illustrated in FIGS. 2A and 4A);

FIGS. 7A to 7F illustrate, in block diagram form, exemplary embodiments of a system including a computer (e.g., host computer or processor) and processing circuitry, connected thereto, wherein the processing circuitry includes the MAC processing pipeline(s) and conversion circuitry, according to certain aspects of the present invention, wherein the conversion circuitry (e.g., Fkl-to-Gkl conversion circuitry, Gkl-to Fkl conversion circuitry, Fkl-to-Hkl conversion circuitry and/or Gkl-to-Hkl conversion circuitry) may be implemented in, for example, the computer, a processor in/of the computer and/or in the processing circuitry connected thereto (i.e., the processing circuitry which includes the MAC processing pipeline(s)); although in certain embodiments herein describe and illustrate the conversion processes of the data format and/or width, length or size of the filter coefficients or weights as being implemented in the computer (e.g., via a processor therein) and/or in the multiplier-accumulator processing circuitry (which includes the execution pipeline for filtering image data via the multiplier-accumulator circuitry), such conversion processes may be partially or fully implemented via circuitry in/on any of the circuitry of, for example, the system; notably, the processing circuitry (which includes the MAC processing pipeline(s)) may be disposed on/in an integrated circuit of the computer and/or processor of the computer or separate therefrom)

Figure 8A:
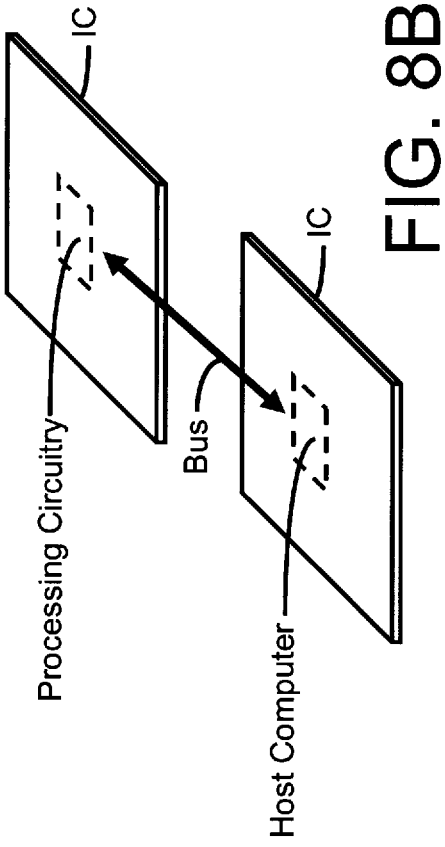
Figure 8B:
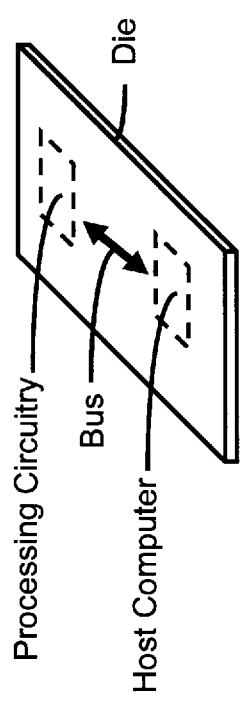
Figure 8C:
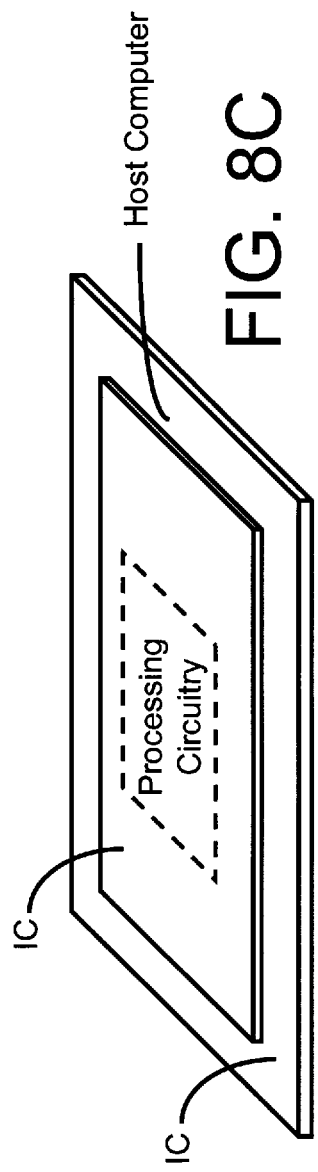
Figure 8D:
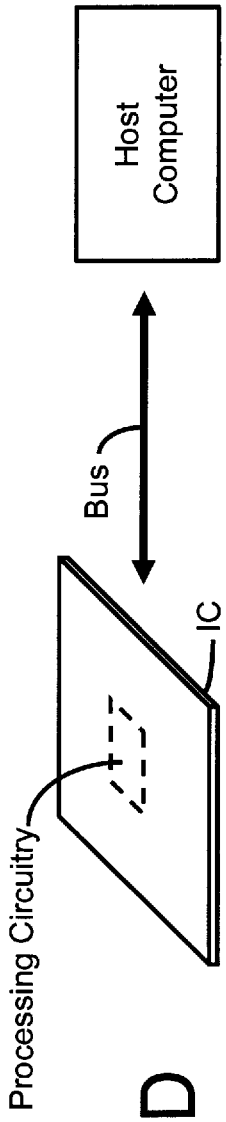
Figures 10B, 10C:
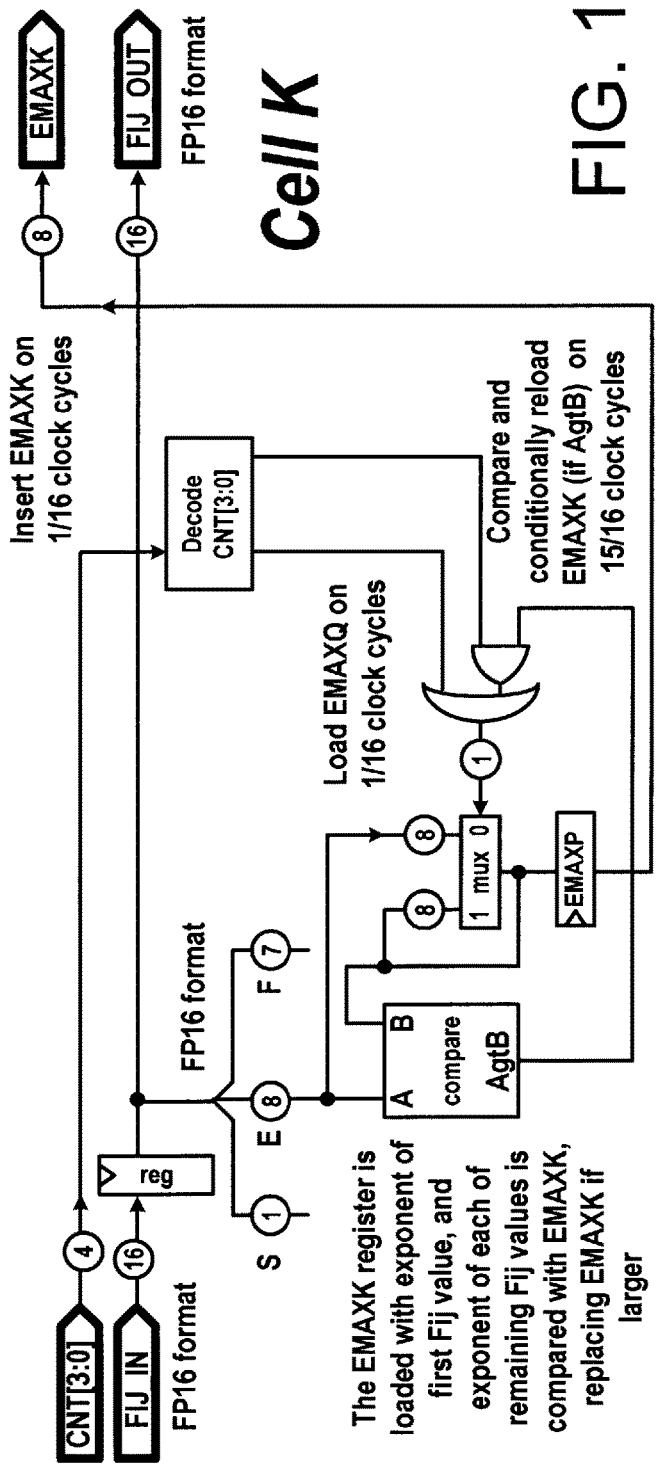
Figure 10D:
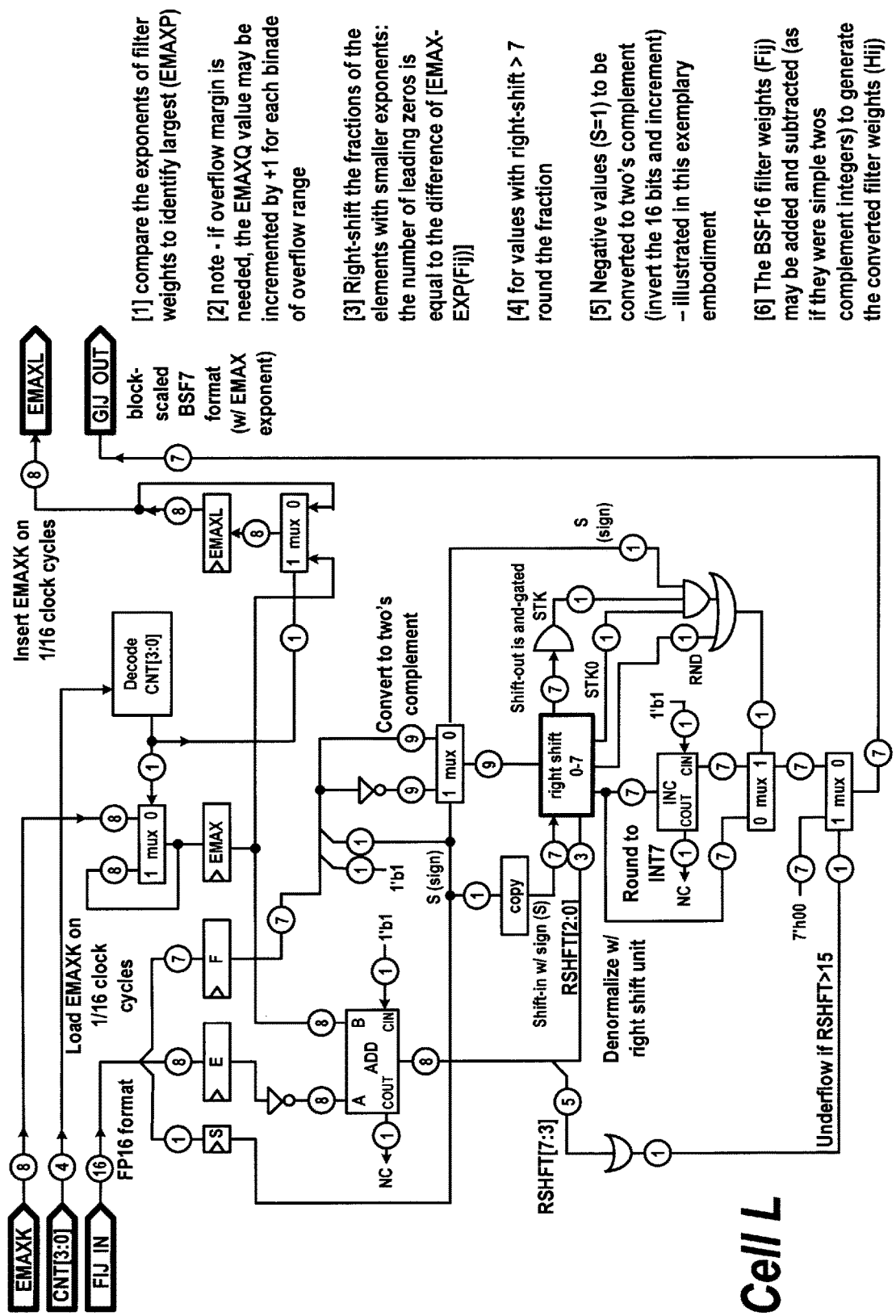

FIG. 8A illustrates a die including an integrated circuit, in accordance with aspects and/or embodiments of the present inventions, wherein a computer (e.g., host computer or processor) and processing circuitry (including MAC processing pipeline(s)), connected thereto, are disposed on or integrated in the same die; notably, although not separately illustrated, in addition thereto or in lieu thereof, the computer may be a processor, controller and/or logic circuitry; here, the bus provides a communication path between processing circuitry and computer, processor, controller, and/or logic circuitry, as described and illustrated herein;

FIG. 8B illustrates two separate die, in accordance with aspects and/or embodiments of the present inventions, wherein the computer (e.g., host computer or processor) may be disposed on a first die and processing circuitry is disposed on a second, different die; here, the layout of the dice is co-planar (i.e., side-by-side) wherein the bus provides a communication path therebetween; notably, similar to that described above with respect to FIG. 8A, although not separately illustrated, in addition thereto or in lieu thereof, the computer may be a processor, controller and/or logic circuitry;

FIG. 8C illustrates two separate die, in accordance with aspects and/or embodiments of the present inventions, in a stacked die architecture wherein the processing circuitry (including MAC processing pipeline(s)) is disposed in/on a first die which is attached or disposed on a second die including the computer (e.g., host computer or processor); here, the layout of the dice is stacked/vertical and the bus may be connected between the dice in any manner now known or later developed, to provide a communication path between the processing circuitry and the computer; notably, the dice may flipped wherein the die including the computer may be disposed or stacked on the die including the processing circuitry; similar to that described above with respect to FIGS. 8A and 8B, although not separately illustrated, in addition thereto or in lieu thereof, the computer may be a processor, controller and/or logic circuitry;

FIG. 8D illustrates a die including an integrated circuit, in accordance with aspects and/or embodiments of the present inventions, wherein the processing circuitry (including MAC processing pipeline(s)), is disposed thereon or integrated therein and the computer (e.g., host computer or processor) is separate therefrom; notably, although not separately illustrated, in addition thereto or in lieu thereof, the computer may be a processor, controller and/or logic circuitry; here, the bus provides a communication path between processing circuitry and computer, processor, controller, and/or logic circuitry, as described and illustrated herein;

FIG. 9 illustrates another exemplary process of converting a group of associated filter coefficients or weights, having a first data format (floating point data format) to associated filter coefficients or weights, having a second data format (block-scaled fraction data format) and a common exponent field, wherein the second provides greater dynamic range without increasing or substantially increasing (within 10% of the total number of bits of the group of associated filter coefficients or weights, and preferably, within 5% of the total number of bits of the group of associated filter coefficients or weights) the allocation, usage or footprint of the filter coefficients or weights, having a second data format, in memory (L3 memory or L2 memory), according to aspects of the present inventions; in this embodiment, the first data format of the filter weights or coefficients is a floating point data format (e.g., FP16) and the second data format is a block-scaled-fraction data format (e.g., BSF7); the exemplary process or operations of data format conversion circuitry converts groups of filter weights (nine in this illustrative embodiment) from a floating point data format (a floating point data format (FP) having 16 bits (FP16)) to a fixed point data format (in this illustrative embodiment, a BSF7 format in the illustrative embodiment) by (i) determining a largest exponent of the data/values (e.g., by comparing the exponents of each associated filter weights of the group of filter weights (e.g., on a rolling basis), (ii) incorporating a right shift of the fraction filed for each data/value with a smaller exponent and the fraction field of each data/value may be rounded (e.g., to comply with the BSF precision of the fraction field—which may be predetermined), and (3) implementing a two's complement operation (invert the bits and increment) where the filter weight is a negative value;

FIG. 10A illustrates a data flow diagram of exemplary data format conversion circuitry (see, e.g., Fkl-to-Gkl conversion circuitry in FIGS. 2A, 2C, 2D, 4A and 4C) of a plurality of filter weight conversion pipelines, implementing the exemplary conversion process of FIG. 9 wherein the associated filter weights from a first data format (floating point data format) to associated filter coefficients or weights, having a second data format (block-scaled fraction data format), in accordance with the present inventions; this exemplary data format conversion circuitry may be employed as the Fkl-to-Gkl conversion circuitry (see FIGS. 2A, 2C, 2D, 4A and 4C) to convert groups of associated filter coefficients or weights, having a first data format (floating point data format), generated by a computer (e.g., host computer or processor), to associated filter coefficients or weights, having a second data format (block-scaled fraction data format); the conversion circuitry includes "K" cells/circuits to receive the Fij data/values in floating point data format and determine or identify the largest exponent (E MAX) of the filter weight or coefficient data/values; the "M" cells perform a temporal delay function/operation for the exponent search; the "L" cells perform the floating point data format to fixed point data format conversion (specifically, FP16 to BSF7 format conversion of the Fij data/values using the E MAX K value); thereafter the data, in a fixed point data format may be, for example, stored in memory (e.g., L3 memory and/or L2 memory);

FIG. 10B illustrates a schematic block diagram of an exemplary K cell of exemplary data format conversion circuitry of FIG. 10A, according to certain aspects of the present inventions, wherein in this exemplary embodiment, the K cell includes circuitry to identify and/or determine the largest exponent (E MAX) of the filter weight data/values (Fij data/values) in floating point data format (in this illustrative embodiment, FP16 format); in this embodiment, the E MAX K register is loaded with exponent of first Fij value, and the exponent of each of the remaining Fij values is compared with E MAX K, replacing E MAX K if/when the circuitry detects or determines a "new" E MAX is larger than the E MAX stored in the E MAX K register;

FIG. 10C illustrates a schematic block diagram of an exemplary M cell of exemplary data format conversion circuitry of FIG. 10A, according to certain aspects of the present inventions, wherein in this exemplary embodiment, M cells include circuitry to temporally delay the filter weight data/values (Fij data/values) a predetermined amount of time to detect, identify and/or determine a largest exponent (E MAX) of the filter weight data/values (Fij data/values) before the filter weights are input into or provided to the floating point data format to fixed point data format conversion circuitry (in this illustrative embodiment, the data format conversion from FP16 to BSF7 in this illustrative embodiment); and FIG. 10D illustrates a schematic block diagram of an exemplary L cell of exemplary data format conversion circuitry of FIG. 10A, according to certain aspects of the present inventions, wherein in this exemplary embodiment, L cells convert the filter weight data/values having a floating point data format (Fij data/values) to filter weights data/values having a fixed point data format (Gij data/values) using the E MAX K value, according to certain aspects of the present inventions; in this illustrative embodiment, each filter weight of the group being converted from a FP16 data format to BSF7 data format; thereafter the filter weight data/values, in a BSF data format, may be, for example, stored in memory (e.g., L3 memory and/or L2 memory).

Again, there are many inventions described and illustrated herein. The present inventions are not limited to illustrative exemplary embodiment including with respect to: (i) particular floating point format(s), particular fixed point format(s), block/data width or length, data path width, bandwidths, values, processes and/or algorithms illustrated, or (ii) the exemplary logical or physical overview configurations, exemplary circuitry configuration and/or exemplary Verilog code.

Moreover, the present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed or illustrated separately herein.

DETAILED DESCRIPTION

In a first aspect, the present inventions are directed to one or more integrated circuits having a plurality of multiplier-accumulator circuits connected or configured in one or more data processing pipeline (e.g., a linear pipeline) to process input data (e.g., image data) using filter weights or coefficients that are converted at least once, via data format conversion circuitry, from a first data format (e.g., integer data format or floating point data format) to a second data format (e.g., fixed point data format such as block-scaled fraction data format) wherein the second data format of the filter coefficients or weights, relative to the first data format, includes a larger or wider dynamic range. In one embodiment, the filter coefficients or weights, having the second data format providing the larger dynamic range, are employed in the multiply operations of the plurality of multiplier-accumulator circuits of the processing pipeline to filter input data (e.g., image data) via the multiply circuits of the plurality of multiplier-accumulator circuits of the processing pipeline in connection with the multiply operations. In another embodiment, the filter coefficients or weights, having the second data format providing the larger dynamic range are (in addition to or in lieu of immediate processing) stored in memory resident on/in the integrated circuit of multiplier-accumulator circuitry for subsequent processing by the circuitry of the data processing pipeline(s). In either embodiment, the change in data format of the filter weights (first data format to second data format) increases the dynamic range of the filter coefficients or weights, while the allocation, usage or footprint of the filter coefficients, in the second data format, in memory (L3 memory or L2 memory), is the same or substantially the same as the memory footprint/allocation corresponding to the plurality of filter coefficients in the first data format (here, an increase in memory allocation, usage or footprint, if any, is less than 10% of the total number of bits of the group of associated filter coefficients or weights, and preferably, less than 5% of the total number of bits of the group of associated filter coefficients or weights).

In one embodiment of the present inventions, the filter coefficients or weights, having the second data format, may be converted further, via conversion circuitry, to filter coefficients or weights having a third data format which is different from the second data format (e.g., filter coefficients having the fixed point data format may be converted to filter coefficients having a floating point data format). In one embodiment, the third data format may be the same as the first data format but different from the second data format. In another embodiment, the third data format is different from the first data format and the second data format. In either embodiment, the filter coefficients, having the third data format, may be immediately applied to or input into the data processing circuitry of a processing pipeline(s) to filter input data (e.g., image data) via multiply circuits of the plurality of multiplier-accumulator circuits of the processing pipeline(s), and/or stored in memory and available to multiplier-accumulator circuitry of the data processing pipeline(s) for subsequent processing.

Notably, image data may include information that is "visual" and/or not "visual" (e.g., identification of an object in the layer or frame)).

In another embodiment of the present inventions, the filter coefficients or weights, having the second data format, may be converted further, via conversion circuitry, to filter coefficients or weights having the second data format and an increase in the number of bits (i.e., bit width, length or size) in the fraction field. As such, in this embodiment, the data format of the filter coefficients or weights is the same but the bit width, length or size of the filter coefficients or weights, having the second data format, is adjusted or modified, via conversion circuitry (e.g., filter coefficients or weights, having a second data format, being increased in width, length or size). For example, the filter coefficients or weights, having the second data format (e.g., block-scaled fraction data format) may be modified from a first length (e.g., 7 bits) to a second length (e.g., 12 bits). Thereafter, the filter coefficients, having the modified or adjusted length, are processed/converted, via Winograd conversion circuitry, to a Winograd format to facilitate Winograd type processing via the multiplier-accumulator circuitry. In one embodiment, the filter coefficients in a Winograd format may be stored in memory and/or immediately applied to or input into multiplier-accumulator circuitry of the execution pipeline in connection with the multiply and accumulate operations during processing of input data (e.g., image data). For example, the multiplier-accumulator circuitry of the present inventions may implement Winograd processing techniques to process the input data (e.g., image data) using filter weights, in a Winograd format, which may have a fixed point data format or a floating point data format.

In one embodiment, a plurality of filter coefficients or weights are associated or arranged in groups (e.g., nine filter coefficients in each group wherein each group may be arranged in and/or employed as a matrix or block of filter weights (e.g., a 3×3 matrix)). For example, in one illustrative embodiment, a multiplier-accumulator execution pipeline (having a plurality of multiplier-accumulator circuits) concurrently processes a plurality of associated input data/values (e.g., nine input data/values wherein the associated input data/values may also be arranged in and/or employed as a matrix or block (e.g., a 3×3 matrix)). In this embodiment, input data (e.g., image data/pixel) are stored in and/or output from memory (e.g., which is organized in planes or layers) consisting of blocks or two-dimensional arrays of input or image data/pixels (M×M, e.g., where M=3). The input or image data/pixels of each two-dimensional array (e.g., 3×3 array or set of data) correlates with/to or contributes to an output data value. The memory (the same or different memory that stores the input data) stores the associated filter weights or coefficients, and may also output the filter weights or coefficients in blocks or arrays (M×M, e.g., where M=3).

In one embodiment, the execution pipeline (having a plurality of multiplier-accumulator processing circuits) concurrently processes a plurality of associated input data/values (e.g., nine input data/values wherein the associated input data/values may be arranged in, input into the processing circuitry and/or employed as a matrix (e.g., a 3×3) or block using a plurality of filter weights or coefficients associated therewith (e.g., nine associated filter coefficients in each group wherein each group may be arranged, in input into the processing circuitry and/or employed as a matrix or block (e.g., a 3×3) of filter coefficients). In this embodiment, the plurality of multiplier-accumulator processing circuits of the execution pipeline of the present inventions concurrently process the group of input data using the associated group of filter weights. As noted above, the processing may employ the circuitry, structures, architectures, function and operation of the multiplier-accumulator execution pipeline(s) implementing processing techniques are described and/or illustrated in the '164 application, '413 application, '111 application and '161 application identified above—all of which, as stated above, are incorporated herein by reference.

In another embodiment, the execution pipeline (having the multiplier-accumulator processing circuits) concurrently processes a plurality of associated input data/values (e.g., sixteen input data/values wherein the associated input data/ values may be arranged in, input into the processing circuitry and/or employed as a matrix (e.g., a 4×4) or block using Winograd processing techniques. In this regard, a plurality of associated filter coefficients or weights are also arranged in or employed by and/or input into the processing circuitry in groups (e.g., 16 filter coefficients in each group wherein each group may be arranged in and/or employed as a 4×4 matrix)) wherein each group of input data/values is processed, via Winograd processing techniques and circuitry, using an associated group of associated filter weights.

In one embodiment, in conjunction with Winograd data processing, the circuitry and techniques transform or convert blocks or groups of input data/values, which may be stored in memory (e.g., layers consisting of two-dimensional arrays of image pixels), from an M×M matrix to an N×N matrix (where N and M are positive integers, and N is greater than M (e.g., M=3 and N=4)). The circuitry and techniques also transform or convert groups or blocks of filter weights, which may also be stored in memory in M×M blocks (e.g., layers consisting of two-dimensional arrays of filter weights or coefficients), from an M×M matrix to an N×N matrix or blocks of associated filter weights. Here, each M×M matrix or block of associated filter weights or coefficients is associated with one or more M×M matrices of associated input data/values. Here, Winograd conversion circuitry is employed to convert the data to a Winograd format wherein the blocks or groups of input data/values and filter weights are transformed from M×M blocks to N×N blocks which are suitable for Winograd data processing.

After the aforementioned conversions, the multiplier-accumulator circuitry processes the N×N input data using the associated N×N filter weights or coefficients using Winograd data processing techniques. In this regard, the plurality of multiplier-accumulator circuits of the execution pipeline may employ one or more of the Winograd processing techniques, circuitry, architectures, functions, processes, and/or operations described and/or illustrated in the '111 application, the '161 application, the '631 application and/or the '293 application identified above—all of which, as stated above, are incorporated by reference herein.

With reference to FIGS. 1A and 1B, in one embodiment, blocks or groups of filter weights or coefficients, having a first data format, may be generated by a computer (e.g., host computer or processor). The first data format of the blocks or groups of filter weights may be an integer data format (e.g., 8 bit—see FIG. 1A) or floating point data format (e.g., 16 bit—see FIG. 1B). The filter weights, having a first data format, of the blocks or groups of filter coefficients, are input into data format conversion circuitry which converts the filter weights from the first data format to a second data format wherein, in one embodiment, the filter weights in the second data format stored in memory (e.g., L3 memory (e.g., DRAM) and/or L2 memory (e.g., SRAM)). The second data format may be a block-scaled fraction ("BSF") data format including an exponent value.

In one embodiment, a plurality of filter coefficients are associated and/or employed in groups or blocks (e.g., nine filter coefficients in a group/block wherein each group/block may be arranged in a matrix (e.g., a 3×3 matrix)) and, in one embodiment, the filter coefficients are stored and/or organized in memory as a matrix of plurality of associated filter coefficients. Each filter coefficient or weight includes a fraction field/value and an exponent field/value and may include a sign field/value. For example, the data format conversion circuitry converts each filter weight of the group of filter weights to a BSF data format including a sign field/value (e.g., 1 bit), a fraction field/value (e.g., 6 bits) and an exponent field/value (e.g., 8 bit) wherein the exponent is common to the associated filter coefficients (e.g., the nine filter coefficients). (See, FIG. 1A). In this way, the allocation, usage or footprint of the filter coefficients of the group of associated filter coefficients, having a second data format, in memory (e.g., L3 memory and/or L2 memory) is the same as or substantially the same (within 10% of the total number of bits of the group of associated filter coefficients or weights, and preferably, within 5% of the total number of bits of the group of associated filter coefficients or weights) as the memory allocation, usage or footprint corresponding to the plurality of associated filter coefficients in the first data format. Moreover, the change in data format of the filter weights (first data format to second data format) increases the dynamic range of the filter coefficients or weights.

With reference to FIG. 1A, in one embodiment, the filter coefficients having the first data format (Fkl values), generated, for example, by a computer or processor, may be stored or maintained in an integer data format (e.g., 8 bit—"INT8" data format) in, for example, memory (e.g., DRAM). Thereafter, the filter coefficients or weights are converted, via data format conversion circuitry, to a second data format (Gkl values)—in this exemplary embodiment, a BSF data format. Here, the data conversion circuitry converts a group of associated filter coefficients (e.g., nine filter coefficients are associated and/or organized in a 3×3 matrix or block) wherein each group of filter weights, as a whole, requires the same or substantially the same memory footprint, allocation or usage as the group of filter coefficients or weights in the first data format (e.g., each 3×3 block or group of filter weights may be allocated 72 bits of memory). As such, a 3×3 block or group of 8 bit filter weights or coefficients, in an integer data format, are modified, via data format conversion circuitry, to a BSF7 data format, which provides enhanced, larger and/or increased dynamic range of each filter weight, without increasing the memory usage, requirements, footprint or allocation of the group of filter weights (e.g., the 72 bits are allocated to nine BSF7 values having an 8 bit or 9 bit common or shared exponent E MAX).

With reference to FIG. 1B, where the filter coefficients, having a first data format, are in a floating point data format (e.g., FP16), the data format conversion circuitry may convert the filter coefficients from the floating point data format to filter coefficients having a fixed point data format (e.g., a block-scaled-fraction data format). (See FIG. 1D for background). As noted above, in one embodiment, a plurality of filter coefficients are associated (e.g., nine filter coefficients are associated in a 3×3 matrix) as a group or block wherein the format data conversion circuitry generates filter coefficients having a BSF data format (including a sign, a value and an exponent (e.g., 8 bit)). (See, FIG. 1B). In this embodiment, the memory footprint, allocation, use and/or bandwidth corresponding to the plurality of associated filter coefficients in the second data format, as a whole or in the aggregate, is less than the memory footprint/allocation/use corresponding to the plurality of associated filter coefficients in the first data format.

With continued reference to FIG. 1B, in one embodiment, a plurality of filter coefficients are associated and/or employed in groups or blocks (e.g., nine filter coefficients in a group/block wherein each group/block may be arranged in a matrix (e.g., a 3×3 matrix)). Each group of associated filter coefficients may be stored and/or organized in memory as a matrix of plurality of filter coefficients. Each filter coefficient or weight includes a fraction field/value and an exponent field/value and may include a sign field/value. For example, the data format conversion circuitry converts each filter weight of the group from a floating point (FP) data format to a BSF data format including a sign field/value (e.g., 1 bit), a fraction field/value (e.g., 6 bits) and an exponent field/value (e.g., 8 bit) wherein the exponent and the exponent field is common to the associated filter coefficients (e.g., the nine filter coefficients) of the group. (See, FIG. 1B). Here, the exponent field and value in the FP data format are distinct/separate for each filter coefficient of the group whereas, after conversion, the exponent value and the exponent field is common to the associated filter coefficients. In this way, the allocation, usage or footprint of the filter coefficients in memory (e.g., L3 memory and/or L2 memory) of the group of associated filter coefficients, having a second data format, in the aggregate, is the same as or less than the memory allocation, usage or footprint corresponding to the plurality of associated filter coefficients in the first data format.

As noted above, the data format conversion circuitry, and processes implemented thereby, may be disposed or implemented in the computer (e.g., via a processor therein) and/or in discrete logic and/or in an integrated circuit (e.g., the integrated circuit including the multiplier-accumulator processing circuitry which includes the execution pipeline for filtering image data via the multiplier-accumulator circuitry). In this embodiment, each filter weight, in a first data format (FPx or FPxx), of the group of filter weights or coefficients are converted, via the data format conversion circuitry, to a corresponding filter weight or coefficient in a second data format (BSFx or BSFxx). With reference to FIG. 1B, in one exemplary embodiment, where the first data format is a 16 bit floating point data format (FP16) and the second data format is a seven bit block-scaled-fraction data format (BSF7), the data format conversion circuitry may process the filter weights having the first data format (FP16) to generate filter weights having the second data format (BSF7) or coefficients as follows:

[1] the exponents of the nine filter weights (FP) are compared to determine the largest wherein the largest exponent becomes E MAX;

[2] the filter weights (FP) have a hidden/implicit fraction bit of "1" in the bit position with a value of "1.0"—this bit is added to the seven bits of the fraction field of the value in the FP16 data format;

[3] for each filter weight in the second data format (BSF), the six bit fraction field of the filter weight is right-shifted by the amount (E MAX-EXP[kl])—notably, the fraction values in the BSF7 data format may have leading zeros;

[4] each filter weight in the second data format (BSF) is rounded to a six bit fraction (significant bits may have been right-shifted past this boundary); and

[5] if the filter weight in the second data format (BSF) uses a two's complement numeric data format and the sign bit is negative (e.g., one), then the fraction and sign must be inverted and incremented; if, however, the BSF7 sign-fraction uses a sign-magnitude numeric data format, this step of the process may be omitted.

In one embodiment, each filter weight of the groups of filter weights which is stored in memory (e.g., L3 memory and/or L2 memory) is converted from the second data format (e.g., BSF7) to a third format. The third format may be correlated to the input data/vales (e.g., image data) and the processing circuitry of the MAC processing or execution pipeline(s). For example, where the input data/values (e.g., the image data to be processed) have a floating point data format, and the processing circuitry is a floating point type, each filter weight of the groups of filter weights which is stored in memory (e.g., L3 memory and/or L2 memory) is converted from the BSF7 to a floating point data format (e.g., 16 bit—i.e., FP16). Notably, the filter weights in the second data format may be initially stored in a first memory (e.g., L3 memory such as DRAM) and, thereafter, transferred—read from the first memory and subsequently written to a second memory (e.g., L2 memory such as SRAM).

With reference to FIGS. 1D and 2A, the filter weights of the groups of filter weights are read from memory and input into data format conversion circuitry (Gkl-to-Fkl). The data format conversion circuitry (Gkl-to-Fkl) converts the data format of each filter weight from a block-scaled-fraction data format to a floating point data format and, in this illustrative embodiment, stores the filter weights, having the floating point data format, of each group in memory (L1 memory and/or L0 memory), for example, organized in a block or matrix (e.g., 3×3). As such, in one embodiment, the data format conversion circuitry (Gkl-to-Fkl) converts and generates filter coefficients or weights having a second data format (Gkl values), for example, in a block-scaled-fraction data format (e.g., BSF7 numeric data format), to filter coefficients or weights having a third data format (Fkl values), for example, in a floating point data format (e.g., FP16 numeric data format).

Notably, the filter coefficients or weights, having a second data format (Gkl values), may have been earlier converted thereto via data format conversion circuitry (see, e.g., FIGS. 1A and/or 1B). Such data format conversion circuitry, in one embodiment, is located in a computer (e.g., host computer) or external processor (e.g., external to the MAC processing circuitry) wherein filter coefficients, having the second data format, are provided to and/or written into memory that internal to or resident on the integrated circuit including the MAC processing circuitry. (See, e.g., FIG. 2A; see L3 memory and/or L2 memory). In another embodiment, the data format conversion circuitry employed to convert the filter weights from a first data format to a second data format (e.g., implementing the processes of FIGS. 1A and/or 1B) is internal to or resident on the integrated circuit including the MAC processing circuitry). (See, e.g., FIGS. 2C/2D, "Fkl-to-Gkl conversion circuitry"). In this regard, in one embodiment, first data format conversion circuitry is disposed on or integrated into the integrated circuit including the MAC processing circuitry.

Importantly, the data format(s), data widths/lengths and/or values of the filter weights or coefficients in FIGS. 1A-1D, and the processes and/or algorithms illustrated in FIGS. 1A-1C are exemplary. Unless expressly stated, the inventions are neither limited to a particular data format, data width/length and/or value of the filter weights or coefficients in FIGS. 1A and 1B, nor the processes and/or algorithms illustrated therein.

The conversion processes of the data format and/or width, length or size of the filter coefficients or weights may be implemented, via conversion circuitry, in the computer (e.g., via a processor therein) and/or in the multiplier-accumulator processing circuitry (which includes the execution pipeline for filtering image data via the multiplier-accumulator circuitry). That is, circuitry of the computer and circuitry of the multiplier-accumulator processing circuitry may partially or fully implement one, some or all of the conversion processes described and/or illustrated herein. In one embodiment, the conversion circuitry may be partially or fully off-chip (not on or in the integrated circuit including the multiplier-accumulator processing circuitry which includes the plurality of multiplier-accumulator circuits of the execution pipeline) or partially or fully on-chip (on or in the integrated circuit including the multiplier-accumulator processing circuitry which includes the plurality of multiplier-accumulator circuits of the execution pipeline). All combinations and permutations of which circuitry implements or performs one or more, or all of the data format and or length conversion processes are intended to fall within the scope of the present inventions.

Indeed, as noted above, in one embodiment, computer (e.g., host computer or processor) may generate filter weights having the second data format and/or convert the weights or coefficients from the first data format to a second data format. For example, a host computer or processor may, in addition to generating the initial filter weights or coefficients, having a first data format (e.g., an integer data format or a floating point data format), perform processes to convert the data format of those filter weights or coefficients to a second data format (e.g., a fixed point data format (e.g., BSF)). The host computer or processor may convert the filter weights from the first data format to a second data format, using the exemplary processes of FIGS. 1A and/or 1B, and thereafter store the filter weights (e.g., in bocks or groups as discussed above) in memory that is located on/in the integrated circuit including the multiplier-accumulator processing circuitry (which includes the plurality of multiplier-accumulator circuits of the execution pipeline). Notably, the conversion circuitry may be a processor (which is properly programmed) that also is employed to calculate/generate the initial filter weights or coefficients (for example, after the learning phase of the start-up or initialization processes of the system).

The present inventions may employ "improved" handling and generation of the filter coefficient values. For example, in one embodiment:

[1] A "training" system (e.g., a cloud/server based system) is utilized to generate optimized filter coefficient values FPxx in a higher precision, higher range data format (e.g., FP32).

[2] A cloud/server system converts the FP32 filter weights directly to filter weights having a block-scaled fraction BSF7 format (with a common E MAX value) and thereafter communicates, writes and/or provides the filter weights (having the BSF7 format) to memory that is located on/in the integrated circuit including the multiplier-accumulator processing circuitry (which includes the plurality of multiplier-accumulator circuits of the execution pipeline).

[3] Each 72 bit BSF7/E MAX value (i.e., the aggregate of the plurality of associated filter weights of each group of filter weights) may be stored in the L3 memory (e.g., DRAM) of an "inference" system (e.g., a low-cost, low-power system at the "edge" of the cloud/network).

[4] Each 72 bit BSF7/E MAX value (i.e., the aggregate of the plurality of associated filter weights of each group of filter weights) occupies the same or substantially the same memory footprint or allocation in the L3 memory (DRAM) and the L2 memory (SRAM) space as memory footprint or allocation as each nine 8 bit integer values (INT8) corresponding thereto.

[5] Each 72 bit BSF7/E MAX value (i.e., the aggregate of the plurality of associated filter weights of each group of filter weights) also uses the same or substantially the same memory bandwidth as each corresponding INT8 value when loaded from L3 DRAM memory to L2 SRAM memory (e.g., on the inferencing integrated circuitry which includes the multiplier-accumulator circuitry of the execution pipeline that processes the image data via the inferencing circuitry and processes).

[6] Each nine filter weights (having BSF7 format and the associated E MAX value), in one embodiment, is converted into nine filter weights having FP16 values when it is loaded from L2 SRAM memory to L1/L0 SRAM memory. (See, e.g., FIG. 3A).

[7] Using FP16 in L1/L0 memory and BSF7/E MAX in L3/L2 memory may result in or provide a significant reduction in cost for the inference system with a relatively small reduction in accuracy.

Thus, the conversion circuitry of the present inventions may be a processor or logic circuitry disposed in/on, for example, the computer (e.g., host computer or processor) and/or an integrated circuit (which may or may not include the multiplier-accumulator circuitry employed to process the data using the filter weights or coefficients). All combinations and permutations of the location of the data format conversion circuitry and/or data length conversion circuitry are intended to fall within the scope of the present inventions.

With reference to FIG. 2A, in one embodiment, the filter coefficients are initially stored in external/off-chip memory (i.e., memory not disposed or manufactured in/on the integrated circuit of the multiplier-accumulator circuits of the execution pipelines—e.g., L3 memory (DRAM)) or internal/on-chip memory (i.e., memory disposed or manufactured in/on the integrated circuit—such as L2 memory (e.g., SRAM)) in a fixed point data format (e.g., BSF data format). In this embodiment, groups or blocks of associated filter coefficients or weights were converted at least once, via data format conversion circuitry (see, e.g., FIGS. 1A and 1B, and Fkl-to-Gkl conversion circuitry in FIGS. 7C-7F), from a first data format (e.g., integer data format or floating point data format) to the second data format (fixed point data format, e.g., BSF having a common exponent between filter weights of the group associated therewith). These filter weights or coefficients may be stored in memory L3 (e.g., DRAM or SRAM). As noted above, in one embodiment, this initial conversion may provide or generate filter coefficients or weights having a larger or wider dynamic range, relative to the dynamic range of the filter coefficients having the first data format. (See, e.g., FIG. 1A). Indeed, although the change in data format of the filter weights (from the first data format to the second data format) increases the dynamic range of the filter coefficients or weights, the amount of memory used or allocated to store the filter coefficients of each group of associated filter weights in the second data format, in the aggregate, is the same as, substantially the same as, and/or no more than the amount of memory used or allocated to store the filter coefficients in the first data format.

In this embodiment, the filter coefficients or weights having the second data format (Gkl filter weights) may then be written/transferred to memory disposed on/in the integrated circuit of the multiplier-accumulator circuits of the execution pipelines. In this regard, the Gkl filter coefficients or weights are read from L3 memory (e.g., DRAM) and written into L2 memory (e.g., SRAM). With continued reference to FIG. 2A, the filter coefficients or weights, having the second data format, are then converted further, via data format conversion circuitry (here, Gkl-to-Fkl conversion circuitry). In one embodiment, the filter coefficients or weights, having the second data format (e.g., BSF7) are converted or transformed to a data format which is different from the second data format. For example, in one embodiment, the filter coefficients or weights are converted or transformed from a fixed point data format (e.g., BSF) to filter coefficients having a third data format (e.g., floating point data format). (See, FIGS. 1D and 3A). After conversion, the filter coefficients having a third data format (which may be different from or the same as the first data format) may be stored in memory (L1 memory—e.g., SRAM) and available to multiplier-accumulator circuits of the execution pipeline in connection with the multiply and accumulate operations of the image data processing. The data processing may be implemented or performed in the third data format.

In one embodiment, the third data format is a floating point data format (e.g., FP16). In this embodiment, the input data/values (e.g., image data) are also in a floating point data format wherein the filter weight or coefficient data having third data format and the image data having the third data format are input into the multiplier-accumulator circuit (MAC) execution pipelines for processing by the multiplier-accumulator circuits and, as such, the multiply operations performed by the multiplier-accumulator circuits are in a floating point regime. (See FIGS. 2A, 2C and 2D). The multiplier-accumulator circuits, MAC execution pipelines and architectures, and the techniques employed and operations implemented thereby, in one embodiment, are described and/or illustrated in: (1) U.S. Non-Provisional patent application Ser. No. 16/545,345, (2) U.S. Non-Provisional patent application Ser. No. 16/816,164, (3) U.S. Provisional Patent Application No. 62/831,413; (4) U.S. Non-Provisional patent application Ser. No. 16/900,319, (5) U.S. Provisional Patent Application No. 62/865,113, (6) U.S. Non-Provisional patent application Ser. No. 17/019, 212, (7) U.S. Provisional Patent Application No. 62/900, 044, (8) U.S. Non-Provisional patent application Ser. No. 17/031,631, and (9) U.S. Provisional Patent Application No. 62/909,293; these nine (9) patent applications are incorporated herein by reference in their entirety.

Notably, FIG. 2A illustrates a logical overview of an exemplary embodiment of a plurality of multiplier-accumulator circuitry execution pipelines, according to certain aspects of the present inventions, wherein the filter weights or coefficients having a second data format (e.g., a fixed point data format—such as BSF) are stored in memory L2 (e.g., SRAM). The filter weights, having the second data format, may have been loaded into memory L2 from memory L3 where such filter weights or coefficients were initially been stored (e.g., via a computer (e.g., host computer or processor)). In one embodiment the groups of associated filter weights are applied to data format conversion circuitry (Gkl-to-Fkl) to convert the filter weights or coefficients having the second data format to filter weights having a third data format (e.g., a floating point data format) which are then available or applied to, or input into the multiplier-accumulator circuitry of the execution pipelines implement/perform the multiply and accumulate operations to process the input data (e.g., image data).

With continued reference to FIG. 2A, the filter weights (e.g., filter weights identified as "Gkl"), in one embodiment, are generated (e.g., off-chip, for example, in a computer (e.g., host computer or processor)) and organized as M×M blocks of associated filter weights (e.g., a 3×3 block of filter weights). The M×M blocks of associated filter weights are associated with 3×3 blocks of input data (e.g., image data) and initially stored in memory (e.g., L3 memory and/or L2 memory). Each of the filter weight (Gkl) of the group or block includes a second data format, for example, a fixed point data format (e.g., BSF).

Notably, the storage data format of the converted filter weights (Gkl) in the L3 and L2 memory levels may be defined to accommodate the first data format. The filter weights (Gkl) may be, in one embodiment, converted/generated by external circuitry (e.g., a host computer) in the first data format and loaded/stored/written into external memory (e.g., L3). Thereafter, the filter weights (Gkl) may be written/transferred, without modification, into memory disposed on/in the integrated circuit (i.e., internal/on-chip memory), for example, L2 memory (e.g., SRAM). In this way, the size and memory allocation of the memory that stores the filter weights (Gkl), in this illustrative embodiment, L3 memory and L2 memory, is reduced (relative to memory employed in connection with filter weights of subsequent data formats).

In one embodiment, before the filter weights are written into memory that is directly accessible by the multiplier-accumulator circuitry of the execution or processing pipelines, the filter weights (Gkl), which are in a fixed point data format (e.g., an BSF data format), are converted to filter weights (Fkl) which are in a third data format (e.g., a floating point data format, such as, for example, FP16 (at times, here and in the figures, identified as "FP" or "FPxx" "xx" indicates/reflects an exemplary data width). With reference to FIG. 2A, a pipelined data format conversion circuitry (Gkl-to-Fkl) is employed to change or convert the plurality of Gkl filter weights of each groups of filter weights from the second data format to a corresponding plurality of Fkl filter weights, each filter weight having the third data format. The format conversion circuitry (Gkl-to-Fkl) is disposed before the memory that is directly accessible by the multiplier-accumulator circuitry of the processing pipelines which performs the multiply and accumulate operations—for example, logically disposed between the L2 memory and L1 memory so that the filter weights are converted when the filter weights are read from L2 memory and written to L1 memory (which is directly accessible by the multiplier-accumulator circuitry).

With continued reference to FIG. 2A, an M×M (e.g., 3×3) block of filter weights (Fkl) in the second data format are applied to an M×M (e.g., 3×3) block of image pixels at each (i,j) image pixel position in an input image layer. In this embodiment, the sum of the nine multiplications (the inner product) generates a single value. This operation is repeated across a plurality of input image layers (e.g., 64 input image layers), and the inner product values (e.g., 64 inner product values) are summed into a single output pixel value at (i,j). This operation is repeated across the plurality of pixels (e.g., 512×256 pixels) of the input image layers to produce one layer (e.g., a 512×256 layer) of the output image (index K). This is repeated a plurality of times (e.g., an additional 64 times) to form a plurality of the output layers (index L) (e.g., the 64 output layers). Details of, among other things, the circuitry, structures, architectures, function and operation of the multiplier-accumulator execution pipelines are described and/or illustrated in the nine patent applications identified above—which have been incorporated by reference herein.

With continued reference to FIG. 2A, the storage data format in the L3 and L2 memory levels correspond to Gkl filter weights (second data format). The storage data format in the L1 memory level corresponds to Fkl filter weights (third data format). The data format conversion circuitry reads the filter weights from L2 memory, converts the data format of the filter weights from Gkl to Fkl, and writes/stores the filter weight in the third data format in L1 memory. The filter coefficients are converted, via data format conversion circuitry, from a second data format to a third data format. (See, FIGS. 3A and 3B) In this embodiment, the second and third data formats of the filter weights, relative to the first data format, provide a larger or wider dynamic range. Thereafter, the filter coefficients having the third data format (e.g., floating point data format) are provided to or read by the multiplier-accumulator circuits of the processing pipeline(s) in connection with the multiply and accumulate operations of the multiplier-accumulator circuitry which processes input data (e.g., image data).

Notably, the accumulation operations are typically a higher precision numeric data format. The input data/values Dijk are held in lower precision numeric data formats in the L3 and L2 memory levels. The Fkl filter weight values, in particular, may have the largest impact on L2/L3 memory capacity and bandwidth, and are often in the lowest precision data format (e.g. 8b). Moreover, the filter weight may present processing limitations as a result of numerical error due to the limited dynamic range of the data format filter weights (Gkl). This may be exacerbated by the large number of terms that are eventually accumulated into each output pixel (for example, 572 terms in this exemplary/illustrative embodiment) in connection with the multiply and accumulate operations of the multiplier-accumulator circuitry of the execution or processing pipelines.

In another embodiment, the filter coefficients or weights are provided or input to the integrated circuit including the multiplier-accumulator circuits of the MAC execution pipelines having a first data format (filter weights (Fkl) having, for example, an integer data format or floating point data format). (See, e.g., FIGS. 1A and 1B). In this embodiment, the integrated circuit includes data format conversion circuitry to convert the filter weights of the group of associated filter weights from the first data format to a second data format (e.g., fixed point data format such as BSF). For example, with reference to FIGS. 1A, 1B, 2C and 2D, groups or blocks of associated filter coefficients or weights are converted, via data format conversion circuitry (Fkl-to-Gkl), from a first data format (e.g., integer data format or floating point data format) to the second data format (fixed point data format, e.g., BSF having a common exponent between filter weights of the group associated therewith). These filter weights or coefficients may be stored in memory L3 memory (e.g., DRAM) and/or L2 memory (e.g., SRAM). As noted above, in one embodiment, this initial conversion may provide or generate filter coefficients or weights having a larger or wider dynamic range, relative to the dynamic range of the filter coefficients having the first data format. (See, e.g., FIG. 1A). Indeed, although the change in data format of the filter weights (from the first data format to the second data format) increases the dynamic range of the filter coefficients or weights, the amount of memory used or allocated to store the filter coefficients of each group of associated filter weights in the second data format, in the aggregate, is the same as, substantially the same as, and/or no more than the amount of memory used or allocated to store the filter coefficients in the first data format.

With continued reference to FIGS. 2C and 2D, the filter coefficients or weights (Gkl filter weights), having the second data format, are then converted further, via data format conversion circuitry (here, Gkl-to-Fkl conversion circuitry). In one embodiment, the filter coefficients or weights, having the second data format (e.g., BSF7) are converted or transformed to a third data format which is different from the second data format. For example, in one embodiment, the filter coefficients or weights are converted or transformed from a fixed point data format (e.g., BSF) to filter coefficients having a third data format (e.g., floating point data format). (See, e.g., FIGS. 1D and 3A). Thereafter, the filter coefficients having a third data format (which may be different from or the same as the first data format) may be stored in memory (e.g., L1 memory—such as SRAM) and thereafter available to multiplier-accumulator circuitry of the execution pipeline in connection with the multiply and accumulate operations of the image data processing. The data processing may be implemented or performed in the third data format.

FIG. 3A illustrates an exemplary process to convert or generate the filter coefficients or weights to a third data format (Fkl values), for example, a floating point data format (in this exemplary embodiment, FP16 numeric data format), from filter coefficients or weights having a second data format (Gkl values), for example, in a BSF data format (in this exemplary embodiment, BSF7 numeric data format). FIG. 3B illustrates, in circuit block diagram form, details of an exemplary circuit block diagram of the logical block diagram illustrated in FIGS. 2A, 2C and 2D employed to convert the filter weights or coefficients having the second data format (here, BSF data format) to filter weights having a third data format (here, a floating point data format) as well as circuit implementation of the processes illustrated in FIG. 3A, according to one embodiment of the present inventions.

With reference to FIGS. 3A and 3B, the data format conversion circuitry (Gkl-to-Fkl) implements or performs the following operations/functions wherein, consistent with the discussion above, each input filter weight (to the data format conversion circuitry (Gkl-to-Fkl)) is designated/identified as Gkl and each output filter weight is designated/identified as Fkl:

[11] If a sign-fraction value is negative, invert and increment if the Gkl values are in two's complement data format. If the Gkl values are in sign-magnitude data format, this step may be omitted.

[12] The number(s) of leading zeros in the fraction is/are counted (PEN value).

[13] The PEN value is used to adjust the exponent in the Fkl value.

[14] The PEN value is also is used to left shift the Gkl fraction field so that the field is normalized (with an MS fraction bit set to one—the bit in this bit position will be stripped off (hidden/implicit bit) in the FP16 data format of the Fkl value.

[15] Left-shift the fraction of each element by the PEN amount—this will normalize it so the MS fraction bit is 1.0

[16] The Fkl fraction field is rounded to seven bits (plus the hidden bit)—and, if there is mantissa overflow, the exponent is incremented.

Notably, with specific reference to FIG. 3A, in one embodiment, the Fkl weights are stored in a fixed point data format in the L3 DRAM memory and L2 SRAM memory (internal/on-chip memory), with each 3×3 block using 72 bits of memory. The data format size of the Fkl weights is less important once the weights are read from L1 memory to L0 memory (SRAM memories) in the MAC array. Here, the illustration functionally depicts how, in this exemplary embodiment, a 3×3 block of 8 bit Fkl weights are modified to provide greater dynamic range without increasing the memory capacity footprint or memory bandwidth requirements. The 72 bits is allocated to nine BSF7 weights (block-scaled-fraction data format), with 9 bits available for a shared exponent E MAX. The filter weights, having a BSF7 data format, are passed to the data format conversion circuitry (Gkl-to-Fkl) of the data format conversion pipeline, where the weights are converted or changed from a BSF7 data format to the FP16 data format and, thereafter written to or loaded into the L1 memory and/or L0 memory for use by the multiplier-accumulator circuits of the MAC execution pipeline. Although, the memory footprint or usage has doubled in size, from 72 bits to 144 bits for each 3×3 block of associated 8 bit Fkl weights, but the L1 memory and/or L0 memory consume a relatively small fraction of the total component area on the integrated circuit.

With reference to FIG. 4A, in another embodiment of the present inventions, rather than converting the filter coefficients or weights from a second data format to a third data format, the conversion circuitry adjusts or modifies the width, length or size of the filter coefficients or weights, having the second data format (e.g., filter coefficients or weights, having a second data format, are increased in width, length or size). In one embodiment, the filter coefficients or weights, having the second data format (e.g., block-scaled-fraction data format) are modified from a first length (e.g., 7 bits) to a second length (e.g., 12 bits) and converted to a Winograd format via Winograd conversion circuitry. Thereafter, the filter coefficients, having the modified or adjusted length, may be stored in memory and available to multiplier-accumulator circuitry of the execution pipeline in connection with the multiply and accumulate operations during image data processing.

In one embodiment, the filter coefficients, having the modified or adjusted length, may be applied to Winograd conversion circuitry, to convert the filter weights to a format and block size (e.g., from a 3×3 to a 4×4 group or block size) that is suitable for employing multiplier-accumulator circuitry to implement Winograd processing techniques to process the input data (e.g., image data). For example, where the second data format is a BSF data format and the width, length or size of the filter coefficients or weights is 12 bit (i.e., BSF12), the data format conversion circuitry (Gkl-to-Fkl) of the embodiment of FIG. 4A may further convert the block or group of filter weights to a Winograd format, via Winograd conversion circuitry. Here, the data format conversion pipeline adjust the bit length of each filter weight of the group and converts the filter weights to a format that accommodates Winograd data processing. Notably, the conversion circuitry and the multiplier-accumulator circuitry may implement Winograd techniques to process the input data (for example, as described and/or illustrated in U.S. Non-Provisional patent application Ser. No. 16/796,111, U.S. Provisional Patent Application No. 62/823,161, U.S. Non-Provisional patent application Ser. No. 17/031,631 and/or U.S. Provisional Patent Application No. 62/909, 293—all of which, as stated above, are incorporated by reference herein).

With that in mind, and with reference to FIGS. 4A and 5, in one embodiment, the filter coefficients are initially stored in memory (e.g., external/off-chip memory (e.g., L3 memory) or internal/on-chip memory (i.e., memory disposed or manufactured in/on the integrated circuit—such as L2 memory) in a fixed point data format (e.g., BSF data format). Here, the filter coefficients or weights were converted at least once, via data format conversion circuitry (see, e.g., FIGS. 1A and 1B, and Fkl-to-Gkl conversion circuitry in FIGS. 7C-7F), from a first data format (e.g., integer data format or floating point data format) to the second data format (fixed point data format, e.g., BSF) and stored in L3 memory (e.g., DRAM). As noted above, this initial conversion provides or generates filter coefficients or weights having a larger or wider dynamic range, relative to the dynamic range of the filter coefficients having the first data format. Indeed, although the change in data format of the filter weights (from the first data format to the second data format) increases the dynamic range of the filter coefficients or weights, the amount of memory used or allocated to store the filter coefficients in the second data format is the same or substantially the same as (or no more than) the amount of memory used or allocated to store the filter coefficients in the first data format.

In this embodiment, the filter coefficients or weights having the second data format (here, Gkl filter weights) may then be written or transferred to memory disposed on the integrated circuit having the multiplier-accumulator circuitry of the execution pipeline(s). In this regard, the Gkl filter coefficients or weights are read from L3 memory and written into L2 memory (e.g., SRAM) which is disposed on the integrated circuit including the multiplier-accumulator circuitry of the execution pipeline(s). With continued reference to FIG. 4A, the filter coefficients or weights, having the second data format, are then modified, via conversion circuitry (here, Gkl-to-Hkl conversion circuitry), to filter coefficients or weights having the second data format and an increased width, length or size (relative to the Gkl filter coefficients or weights). (See, FIG. 5). In addition, the Winograd conversion circuitry provides an increase block size (e.g., 16 associated filter weights). Thereafter, the Hkl filter coefficients (which have the second data format and increased width, length or size may be stored in memory (e.g., L1 memory—such as SRAM) and are available to multiplier-accumulator circuitry of the execution pipeline in connection with the multiply and accumulate operations of the data processing. Here, the multiplier-accumulator circuitry may implement Winograd processing techniques, to process the image data, as described and/or illustrated in the four (4) patent applications identified immediately above. (See, e.g., FIG. 4D).

Thus, in this embodiment, the filter coefficient (having the fixed point data format and a first width, length or size) may be converted, via conversion circuitry, to a different or second width, length or size of the fixed point data format and then stored in internal/on-chip memory (e.g., L1 memory). In this way, the filter coefficients of the fixed point data format having the modified or second size (in this exemplary embodiment, BSF12) are available to, for example, processing circuitry for use in connection processing of the image data by the multiplier-accumulator circuitry implementing Winograd processing techniques.

In another embodiment, the filter coefficients or weights are provided or input to the integrated circuit including the multiplier-accumulator circuits of the MAC execution pipelines having a first data format (filter weights (Fkl) having, for example, an integer data format or floating point data format). (See, e.g., FIGS. 1A and 1B). In this embodiment, the integrated circuit includes data format conversion circuitry to convert the filter weights of the group of associated filter weights from the first data format to a second data format (e.g., fixed point data format such as BSF). For example, with reference to FIGS. 1A, 1B and 4C, groups or blocks of associated filter coefficients or weights are converted, via data format conversion circuitry (Fkl-to-Gkl), from a first data format (e.g., integer data format or floating point data format) to the second data format (fixed point data format, e.g., BSF having a common exponent between filter weights of the group associated therewith). These filter weights or coefficients may be stored in memory L3 memory (e.g., DRAM) and/or L2 memory (e.g., SRAM). As noted above, in one embodiment, this initial conversion may provide or generate filter coefficients or weights having a larger or wider dynamic range, relative to the dynamic range of the filter coefficients having the first data format. (See, e.g., FIG. 1A). Indeed, although the change in data format of the filter weights (from the first data format to the second data format) increases the dynamic range of the filter coefficients or weights, the amount of memory used or allocated to store the filter coefficients of each group of associated filter weights in the second data format, in the aggregate, is the same as, substantially the same as, and/or no more than the amount of memory used or allocated to store the filter coefficients in the first data format.

With continued reference to FIG. 4C, the filter coefficients or weights (Gkl filter weights), having the second data format, are then converted further, via data format conversion circuitry (here, Gkl-to-Hkl conversion circuitry). In one embodiment, the filter coefficients or weights, having the second data format (e.g., BSF7) are converted or transformed as described above with respect to FIGS. 4A and/or 5. For the sake of brevity, that discussion will not be repeated here.

Notably, with reference to FIG. 5, in one embodiment, 72 bits may be allocated to nine BSF7 filter weights (in this exemplary embodiment, in the BSF data format), with 9 bits available for a shared or common exponent E MAX. The G-to-H conversion circuitry changes the Gkl filter coefficient, having BSF7 data format, to Hkl filter coefficients, having BSF12 data format. In short, the conversion circuitry may append "5'b00000" to the least significant bit positions of the Gkl filter coefficient or weights. The Hkl filter coefficients or weights having a BSF12 data format are processed by Winograd conversion circuitry to generate filter weights (Hkl) in a Winograd format. The Hkl filter coefficients or weights may be in a fixed point or converted further to a floating point data format. Thereafter, the filter weights (Hkl) are available to or read by the multiplier-accumulator circuitry of the image data processing circuitry to process the image data via Winograd processing techniques.

In an alternative embodiment, the Gkl filter coefficients or weights are convert, via Gkl-to-Hkl conversion circuitry, to a different data format (e.g., an integer data format (such as INT12 data format)) and, thereafter stored in memory L1 which is directly available to, for example, multiplier-accumulator circuitry of the processing circuitry of the execution pipelines for use in processing the image data using Winograd processing techniques. This alternative embodiment may be employed in connection with the embodiments of FIGS. 4A, 4C and 4D.

In addition, the Gkl-Hkl conversion circuitry transforms or converts the groups of filter weights from M×M arrays (e.g., M=3) to N×N arrays (e.g., N=4). In one embodiment, Gkl-to-Hkl conversion circuitry (e.g., in a pipeline architecture) is employed to convert the data format of the groups of associated filter weights do that the M×M the N×N arrays of filter weights or coefficients may be employed to process input data, via Winograd processing techniques and the multiplier-accumulator circuits of the execution pipelines. Here, the N×N arrays or blocks of filter weights are properly correlated with/to the associated of the input data/values (also N×N arrays or blocks). (See, FIGS. 4A, 4C and 4D). In one embodiment, the output (i.e., the groups of processed filter weights) of the Gkl-to-Hkl conversion circuitry is input/written into or stored in memory as N×N arrays blocks of associated filter weights or coefficients and provided to the multiplier-accumulator circuitry during processing.

With continued reference to FIGS. 4A, 4C and 4D, the multiplier-accumulator circuitry processes the input data (Eij), which has also been converted to facilitate Winograd processing, using the groups of filter weights (Hkl) to generate Eij*Hkl, into the Zij values. Each two-dimensional array/set of data includes input or image data/pixels (e.g., all of the input data or image data/pixels) that correlates with/to or contributes to an output data value. That is, in this embodiment, the multiplier-accumulator circuitry of each execution pipeline of the plurality of pipelines performs a plurality (e.g., 16) multiplications and, in one embodiment, the accumulation operations are implemented or performed in the zij-to-yij conversion block whereby four output pixels at Yijl (2×2) are written to the output plane (in parallel with other Yij 2×2 pixels written into the other output planes).

Notably, FIG. 2B is a physical overview, of a Winograd mode of operation of the multiplier-accumulator execution pipelines of the multiplier-accumulator circuitry, according to certain aspects of the present inventions.

In particular, dij-to-eij conversion circuitry, according to certain aspects of the present inventions, receives input data from memory (e.g., L2 memory) in 4×4 D blocks. Each set of input data (e.g., image data) consists of four 4×4 D blocks which may be read/accessed in 64 words from each physical block of memory (for example, in one embodiment, with each access of L2 SRAM memory. Here, the 4×4 D blocks may be converted to 4×4 E blocks by the 16 dij-to-eij conversion circuitry implementing Winograd conversion operations. The 4×4 E blocks are separated into 16 streams that are sorted by the individual eij values/elements of the 4×4 E blocks. This operation, in one embodiment, is performed by the eij extract logic circuitry (one eij extraction circuitry for each stream (16 in this exemplary embodiment). Each of the 16 eij streams may be directed to the e-shift-in block of one of the 16 multiplier-accumulator execution pipelines of the multiplier-accumulator circuitry.

With reference to FIGS. 4A, 4C and 4D, in one embodiment, F-to-H conversion circuitry is disposed in or incorporated into the execution pipeline circuitry to convert the filter weights or coefficients to Winograd format. The memory (e.g., L2 SRAM memory) stores the 3×3 Gkl blocks of filter weights or coefficients (e.g., finite impulse response (FIR) type). The memory, in this exemplary embodiment, may be segmented or divided into 16 physical blocks, so that 16 sets of data can be read or accessed in parallel by/for the 16 multiplier-accumulator execution pipelines of the multiplier-accumulator circuitry. Here, each set of data consists of four 3×3 Gkl blocks which, in one embodiment, employ 36 accesses from each physical L2 block. The 3×3 Gkl blocks are converted to 4×4 Hkl blocks (in a Winograd format) by the conversion circuitry (in this illustrated embodiment, 16 fkl-to-hkl conversion circuits). These blocks may be written to memory (e.g., L1 SRAM memory) or input directly into the MAC execution pipelines. Regardless, each of the 16 hkl filter weights of a 4×4 H block are input into the execution pipelines of the multiplier-accumulator circuitry and available to the multiplier-accumulator circuitry of each of the execution pipelines for processing of the input data (e.g., image/pixel data).

In one embodiment, sorting is performed by the addressing sequence when reading hkl elements/values in the L1 memory and writing to hkl elements/values in memory (e.g., 16 L0 memories, which, in one embodiment is SRAM). Alternatively, however, the sorting may be done by an hkl extract logic circuitry, similar to the eij extract logic circuitry. Notably, the timing of the transfer between memory (e.g., from L2 memory to L1 memory and from L1 memory to the L0 memories) may not be as critical as the transfer of input and output data between memory (e.g., L2 memory) and the execution pipelines of the multiplier-accumulator circuitry. The weight values or data may be read from memory once and transferred to the pipelines of the multiplier-accumulator circuitry, and then used repeatedly for each of thousands of blocks of 2×2 input pixels.

With continued reference to FIGS. 4A, 4C and 4D, the N×N multiplier-accumulator execution pipelines of the multiplier-accumulator circuitry are employed to accumulate Q×Q pixel output data/values. In one embodiment, the aggregation of the N×N element data/values for the Q×Q output data/pixels is implemented/performed external to the N×N multiplier-accumulator execution pipelines. Here, the N×N product data/elements are accumulated with other N×N product data/elements from other input layers—however, in this embodiment, the individual elements/values are accumulated together into the final Q×Q output data/pixels after performing an operation on the accumulated N×N product data/elements via the Zij-to-Yij-conversion circuitry.

Briefly the Zij-to-Yij conversion circuitry, in one embodiment, receives the 16 Zij streams is directed from the z-shift-out block of one of the 16 multiplier-accumulator execution pipelines of the multiplier-accumulator circuitry. The 4×4 Zij groups or blocks may be assembled from 16 streams that are sorted by the individual Zij elements/values of the 4×4 Z blocks, which may be implemented by the insertion logic circuitry (here, 16 zij insert logic circuitries). The 4×4 Z blocks are converted to 2×2 Y blocks by the zij-to-yij conversion logic circuitry. The L2 memory (e.g., SRAM) may store the 2×2 Y blocks (for example, in a segmented or divided form) into 16 physical blocks, so that 16 sets of data may be written or stored in parallel for the 16 multiplier-accumulator execution pipelines. Here, each set of data may consist of four 2×2 Y blocks, which would include 16 accesses from each physical block of memory (e.g., L2 SRAM memory).

As noted above, the execution pipelines implementing the multiply and accumulate operations of the multiplier-accumulator circuitry include fixed point and/or floating point execution circuitry (e.g., adder circuitry) implementing one or more fixed point or floating point data formats, respectively. The data formats may be user or system defined and/or may be one-time programmable (e.g., at manufacture) or more than one-time programmable (e.g., (i) at or via power-up, start-up or performance/completion of the initialization sequence/process sequence, and/or (ii) in situ or during normal operation). The term "in situ", in the context of this application, means during normal operation of the integrated circuit—and after power-up, start-up or completion of the initialization sequence/process thereof.

In one embodiment, the circuitry of the execution pipelines includes adjustable precision wherein the filter weights provide larger or wider dynamic range. Such precision may be user or system defined and/or may be one-time programmable (e.g., at manufacture) or more than one-time programmable (e.g., (i) at or via power-up, start-up or performance/completion of the initialization sequence/process sequence, and/or (ii) in situ or during normal operation)

In addition thereto, or in lieu thereof, the circuitry of the execution pipelines may concurrently process data to increase throughput of the pipeline. For example, in one implementation, the present inventions may include a plurality of separate multiplier-accumulator circuits (referred to herein (including the text/figures of the applications incorporated by reference), at times, as "MAC") and a plurality of registers (including, in one embodiment, a plurality of shadow registers) that facilitate pipelining of the multiply and accumulate operations wherein the circuitry of the execution pipelines concurrently process data to increase throughput of the pipeline.

In one embodiment, the processing circuitry (which includes a plurality of multiplier-accumulator circuits) of the execution pipelines may concurrently process data to increase throughput of the pipeline. For example, in one implementation, the present inventions may include a plurality of separate multiplier-accumulator circuits (referred to herein, at times, as "MAC" or "MAC circuits") and a plurality of registers (including, in one embodiment, a plurality of shadow registers) that facilitate pipelining of the multiply and accumulate operations wherein the circuitry of the execution pipelines concurrently process data to increase throughput of the pipeline—see, for example, the multiplier-accumulator circuitry, architectures and integrated circuits described and/or illustrated in U.S. patent application Ser. No. 16/545,345, filed on Aug. 20, 2019 and U.S. Provisional Patent Application No. 62/725,306, filed on Aug. 31, 2018. The multiplier-accumulator circuitry described and/or illustrated in the '345 and '306 applications facilitate concatenating the multiply and accumulate operations thereby allowing a plurality of multiplier-accumulator circuitry to perform such operations more quickly (see, e.g., the exemplary embodiments illustrated in FIGS. 1A-1C of U.S. patent application Ser. No. 16/545,345). The '345 and '306 applications are hereby incorporated by reference in their entirety.

In addition thereto, or in lieu thereof, the present inventions may be employed and/or be implemented in conjunction with the circuitry and techniques multiplier-accumulator execution or processing pipelines (and methods of operating such circuitry) having circuitry and/or architectures to process data, concurrently or in parallel, to increase throughput of the pipeline—for example, as described and/or illustrated in U.S. patent application Ser. No. 16/816,164 and U.S. Provisional Patent Application No. 62/831,413; as stated above, the '164 and '413 applications are hereby incorporated by reference in their entirety. Here, a plurality of processing or execution pipelines may concurrently process data to increase throughput of the data processing and overall pipeline.

Notably, the present inventions may be employed or implemented in the multiplier-accumulator circuitry, architectures and integrated circuits that implement multiply and accumulate operations, as described and/or illustrated in U.S. patent application Ser. No. 16/545,345, U.S. patent application Ser. No. 17/019,212, and U.S. Provisional Patent Application No. 62/900,044. The multiplier-accumulator circuitry and architecture described and/or illustrated in these application facilitate, among other things, concatenating the multiply and accumulate operations thereby allowing a plurality of multiplier-accumulator circuitry to perform such operations more quickly. As stated above, these three (3) application are incorporated by reference herein in their entirety.

In addition, the present inventions may also be employed in the circuitry and techniques implementing floating point multiplier-accumulator execution or processing pipelines (and methods of operating such circuitry) having floating point execution circuitry (e.g., adder circuitry) implementing one or more floating point data formats—for example, as described and/or illustrated in U.S. Non-Provisional patent application Ser. No. 16/900,319 and U.S. Provisional Patent Application No. 62/865,113. Here, the circuitry and methods of the pipeline and processes implemented therein described and illustrated in these applications may be employed in the circuitry and techniques described and/or illustrated herein in connection with the one or more execution or processing pipelines, based on or using floating point data formats, that include circuitry to increase data throughput of the multiplier-accumulator circuitry and processing. Notably, as stated above, the '319 and '113 applications are incorporated by reference herein in its entirety.

The present inventions may also be employed or be implemented in conjunction with the circuitry and techniques multiplier-accumulator execution or processing pipelines (and methods of operating such circuitry)—for example, as described and/or illustrated in U.S. Non-Provisional patent application Ser. No. 17/019,212 and U.S. Provisional Patent Application No. 62/900,044. As stated above, the '212 and '044 applications are incorporated by reference herein in its entirety.

Indeed, the present inventions may be employed or implemented in the multiplier-accumulator circuitry, pipelining architectures and integrated circuits (and methods of operating such circuitry), as described and/or illustrated in U.S. Non-Provisional patent application Ser. No. 17/031,631 and U.S. Provisional Patent Application No. 62/909,293. The present inventions may be incorporated into the execution or processing pipelines implementing floating point processing and Winograd type processes, described and/or illustrated in the '631 and '293 applications, to facilitate increasing data throughput of the multiplier-accumulator circuitry and processing while employing or implementing multiplier-accumulator circuitry of the pipeline. The circuitry and techniques described and/or illustrated in the U.S. patent Ser. No. 17/031,631 and '293 applications, as stated above, is incorporated by reference herein in their entirety.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, in one embodiment, the Gkl filter coefficients, having BSF7 data format as set forth in the embodiments described above, may be extended by using the extra field "rsv". (See, e.g., FIG. 6 which illustrates an exemplary extension). With reference to FIG. 6, when RSV=0, the original data format is used. When RSV=1, two bits of the fraction field are used as an exponent offset value. In this embodiment, this exponent offset value is subtracted from E MAX to generate the exponent field for each of the nine values. This embodiment may provide a more uniform level of precision across the nine values. The choice between the implementation of the two different data formats may be implemented or made for each filter weight block or group (e.g., 3×3) for example, depending upon the size distribution across the nine filter weight values. Notably, this embodiment may be employed in any of the embodiments described and/or illustrated herein (for example, the embodiments illustrated in FIGS. 2A, 2C, 2D, 4A and 4C).

The conversion circuitry (e.g., Fkl-to-Gkl conversion circuitry, Gkl-to Fkl conversion circuitry and/or Gkl-to-Hkl conversion circuitry) may be implemented in the host computer, a processor in the host computer and/or an integrated circuit coupled thereto (e.g., the integrated circuit having the multiplier-accumulator circuitry). Although in certain embodiments the conversion processes of the data format and/or width, length or size of the filter coefficients or weights is described as being implemented in the host computer (e.g., via a processor therein) and/or in the multiplier-accumulator processing circuitry (which includes the execution pipeline for filtering image data via the multiplier-accumulator circuitry), such conversion processes may be partially or fully implemented via circuitry any of the integrated circuits of, for example, the system. (See, FIGS. 7A-7F). All combinations and permutations of which circuitry implements or performs one or more, or all conversion processes are intended to fall within the scope of the present inventions.

Further, in one embodiment, the host computer (including processor) and multiplier-accumulator circuitry are integrated in/on one integrated circuit and/or separate integrated circuits that are electrically interconnected (for example, stacked ICs))—see, for example, FIGS. 8A-8C; in another embodiment, the host computer is connected to a multiplier-accumulator processing circuitry (which includes the execution pipeline for filtering image data via the multiplier-accumulator circuitry)—see, for example, FIG. 8D. All combinations and permutations system architecture, integration and/or interconnection are intended to fall within the scope of the present inventions.

As noted above, the data format conversion circuitry, and processes implemented thereby, may be disposed or implemented in the host computer (e.g., via a processor) and/or in discrete logic and/or in an integrated circuitry (e.g., the multiplier-accumulator processing circuitry which includes the execution pipeline for filtering image data via the multiplier-accumulator circuitry). Here, the filter weights or coefficients in a first data format are converted, via the data format conversion circuitry, to filter weights or coefficients in a second data format. In one embodiment, the first data format is a floating point data format (e.g., FP16) and the second data format is a block-scaled-fraction data format (e.g., BSF7). (See, e.g., FIG. 9). In one exemplary embodiment, the process of generating the Gkl filter weights or coefficients, as illustrated in FIG. 9, includes:

[1] the exponents of the nine Fkl values are compared, and the largest becomes E MAX;

[2] the Fkl values have a hidden/implicit fraction bit of "1" in the bit position with a value of "1.0"—this bit is added to the seven fraction bits in the FP16 data format;

[3] the six bit fraction is right-shifted by the amount (E MAX-EXP[kl])—the fraction values in the BSF7 data format may have leading zeros;

[4] the BSF7 value is rounded to a six bit fraction (significant bits may have been right-shifted past this boundary); and

[5] if the BSF7 sign-fraction uses a two's complement numeric data format and the sign bit is one (negative), then the fraction and sign must be inverted and incremented; if, however, the BSF7 sign-fraction uses a sign-magnitude numeric data format, step [5] may not be performed.

FIG. 10A illustrates an exemplary logic overview of the Fkl-to-Gkl format conversion circuitry, according to certain aspects of the present inventions, wherein filter weights or coefficients, in a first data format (in this exemplary embodiment, a floating point data format), are input into and converted to a fixed point data format and the output as filter weights or coefficients, in a second data format (in this exemplary embodiment, BSF7). The exemplary logical overview of the Fkl-to-Gkl format conversion circuitry (a FP16-to-BSF7 conversion pipeline) implements a data format conversion of the initial filter weights—in this exemplary embodiment from a floating point data format to a block-scale-fraction data format.

Notably, Fij-to-Gij label of the format conversion circuitry of FIGS. 10A-10D is equivalent to the Fkl-to-Gkl label of the format conversion circuitry throughout this application. In this regard, the indexes i,j of Fij in FIGS. 10A-10D are equivalent to indexes k,l of Fkl; similarly, the indexes i,j of Gij in FIGS. 10A-10D are equivalent to indexes k,l of Gkl.

FIGS. 10B-10D illustrate, in circuit block diagram form, details of the K, L and M cells, according to certain aspects of the present inventions, of the logical block diagram illustrated in FIG. 10A. The circuitry of the K, L and M cells are employed to convert the filter weights or coefficients in the floating point data format to filter weights or coefficients in a block-scaled-fraction (BSF) data format. Briefly, in one embodiment, the K cell receives the plurality or group of associated filter weights (3×3 Fij filter weights in this illustrative embodiment) in FP16 data format sequentially and identifies/determines the largest exponent (E MAX). The M cells perform a delay of the filter weight data/values during the aforementioned exponent search (i.e., a delay function for the exponent search implemented by the circuitry of the K cell). The L cell performs the FP16 to BSF7 data format conversion of the plurality of Fij filter weights (using the E MAX value) into a corresponding plurality of Gij filter weights having the second data format. As mentioned above, FIG. 9 illustrates this exemplary process of generating the Gkl filter weights or coefficients, implemented via the exemplary circuitry of the K, L and M cells, according to certain aspects of the present inventions.

Notably, in one embodiment, a processor of the host computer may, in addition to generating the initial filter weights or coefficients (Fkl), having a first data format (e.g., floating point data format) may also perform processes to convert the data format of those filter weights or coefficients to a second data format (e.g., a fixed point data format (e.g., BSF7)). In addition thereto, or in lieu thereof, a processor of the host computer may generate the initial filter weights or coefficients, having a first data format (e.g., floating point data format), convert the data format of those filter weights or coefficients to a second data format (e.g., a fixed point data format (e.g., BSF7)) and, thereafter, convert or modify the width, length or size of the filter weights or coefficients, as discussed herein (see, e.g., FIG. 5). Here, the conversion circuitry may be a processor (as properly programmed) that also is employed to calculate/generate the initial filter weights or coefficients (for example, after the learning phase of the start-up or initialization processes of the system).

In addition, although the filter weight conversion circuitry, in the illustrative exemplary embodiments, describes a bit width of the floating point data format of the input data and filter weights as well as the fixed point data format, such bit width(s) is/are exemplary. As noted herein, although several of the exemplary embodiments and features of the inventions are described and/or illustrated in the context of certain size or length filter weights or coefficients (e.g., floating point data format (FPxx), integer data format (INTxx), and fixed point data format (e.g., BSFxx) where: xx is an integer and is greater than or equal to 8, 10, 12, 16, 24, etc.), the embodiments and inventions are applicable of other precisions or lengths. For the sake of brevity, those other contexts and precisions will not be illustrated separately but are quite clear to one skilled in the art based on, for example, this application. Thus, the present inventions are not limited to (i) particular fixed point data format(s) (e.g., integer format (INTxx) and block-scaled fraction format (e.g., BSFxx), block/data width, data path width, bandwidths, values, processes and/or algorithms illustrated, nor (ii) the exemplary logical or physical overview configurations of the particular circuitry and/or overall pipeline, and/or exemplary module/circuitry configuration, overall pipeline and/or exemplary Verilog code.

As noted above, the present inventions are not limited to (i) particular floating point format(s), particular fixed point format(s), operations (e.g., addition, subtraction, etc.), block/data width or length, data path width, bandwidths, values, processes and/or algorithms illustrated, nor (ii) the exemplary logical or physical overview configurations, exemplary module/circuitry configuration and/or exemplary Verilog code.

Moreover, although the data format conversion circuitry of certain exemplary embodiments are determines/identifies the largest exponents of the associated filter weights of the group of filter weights, the data format conversion circuitry may compare the exponents of the associated filter weights to determine the smallest exponent. In this alternative embodiment, the shifting of the fraction field of the filter weights may be modified (e.g., shifted left for filter weights having larger exponents) to accommodate the common exponent field being the smallest exponent of the associated filter weights of the group of filter weights.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

The terms "comprises," "comprising," "includes," "including," "have," and "having" or any other variation thereof, are intended to cover a non-exclusive inclusion, such that a process, method, circuit, article, or apparatus that comprises a list of parts or elements does not include only those parts or elements but may include other parts or elements not expressly listed or inherent to such process, method, article, or apparatus. Further, use of the terms "connect", "connected", "connecting" or "connection" herein should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "a" and "an" herein do not denote a limitation of quantity, but rather denote the presence of at least one of the referenced item. Further, the terms "first," "second," and the like, herein do not denote any order, quantity, or importance, but rather are used to distinguish one element/circuit/feature from another.

In addition, the term "integrated circuit" means, among other things, any integrated circuit including, for example, a generic or non-specific integrated circuit, processor, controller, state machine, gate array, SoC, PGA and/or FPGA. The term "integrated circuit" also means any integrated circuit (e.g., processor, controller, state machine and SoC)—including an embedded processor, controller, state machine, PGA and/or FPGA.

Further, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

Notably, the limitations of the claims are not written in means-plus-function format or step-plus-function format. It is applicant's intention that none of the limitations be interpreted pursuant to 35 USC § 112, ¶6 or § 112(f), unless such claim limitations expressly use the phrase "means for" or "step for" followed by a statement of function and is void of any specific structure.

What is claimed is:

1. An integrated circuit comprising:
a first memory to store a plurality of sets of filter weights;
first data format conversion circuitry having:
inputs to receive the plurality of sets of filter weights from the first memory, wherein each of the sets of filter weights includes a plurality of filter weights having a block-scaled fraction data format;
floating point format conversion circuitry, coupled to the inputs of the first data format conversion circuitry, to convert the filter weights of each set of filter weights from the block-scaled fraction data format to a floating point data format; and
outputs to output the filter weights of each set of filter weights having the floating point data format; and
a second memory coupled to the outputs of the first data format conversion circuitry to receive and store the filter weights of each set of filter weights having the floating point data format; and
a multiplier-accumulator execution pipeline having a plurality of multiplier-accumulator circuits, each of the multiplier-accumulator circuits having:
first inputs to receive image data;
second inputs coupled to the second memory to receive a respective one of the sets of filter weights having the floating point data format; and
multiply-accumulate circuitry to generate output data by performing multiply and accumulate operations using the image data received via the first inputs and the respective one of the sets of filter weights received via the second inputs.

2. The integrated circuit of claim 1 wherein the second memory comprises static random access memory (SRAM).

3. The integrated circuit of claim 1 further comprising second data format conversion circuitry to:
receive first filter data having constituent floating-point-format filter weights;
convert the floating-point-format filter weights of the first filter data to filter weights having the block-scaled fraction data format; and
output the filter weights having the block-scaled fraction data format to the first memory for storage therein as the plurality of sets of filter weights.

4. The integrated circuit of claim 3 wherein the first filter data having constituent floating-point-format filter weights comprises a plurality of sets of floating-point-format filter weights, and wherein
the second data format conversion circuitry further comprises circuitry to perform the following operations with respect to each one of the sets of floating-point-format filter weights:
determine a largest exponent of the constituent filter weights of the one of the sets of the floating-point-format filter weights,
right shift a fraction field of each constituent filter weight of the one of the sets of the floating-point-format filter weights having a smaller exponent than the largest exponent,
round the fraction field of each constituent filter weight of the one of the sets of the floating-point-format filter weights to a block-scaled fraction (BSF) precision, and
two's complement the fraction field of each constituent filter weight of the one of the sets of the floating-point-format filter weights having a negative fraction field.

5. The integrated circuit of claim 3 wherein:
each filter weight received via the second inputs of the multiplier-accumulation circuits and having the floating point data format is constituted by a first number of bits; and
each of the constituent floating-point-format filter weights of the first filter data received within the second data conversion circuitry is constituted by a second number of bits less than the first number of bits.

6. The integrated circuit of claim 3 wherein
the second data conversion circuitry comprises circuitry to determine a largest exponent of the constituent filter weights of each one of the sets of the floating-point-format filter weights.

7. The integrated circuit of claim 6 wherein
the second data format conversion circuitry further comprises circuitry to right shift a fraction field of each constituent filter weight of the one of the sets of the floating-point-format filter weights having a smaller exponent than the largest exponent, round the fraction field to a block-scaled fraction (BSF) precision, and, if negative, perform a two's complement operation on the fraction field.

8. The integrated circuit of claim 1 wherein both the first and second memories comprise static random access memory (SRAM).

9. The integrated circuit of claim 1 further comprising second data format conversion circuitry to:
receive first filter data having constituent integer-format filter weights;
convert the integer-format filter weights of the first filter data to a block-scaled fraction data format; and
output the filter weights having the block-scaled fraction data format to the first memory for storage therein as the plurality of sets of filter weights.

10. An integrated circuit comprising:
a first memory to store a plurality of sets of filter weights;
first data format conversion circuitry having:
inputs to receive the plurality of sets of filter weights from the first memory, wherein each of the sets of filter weights includes a plurality of filter weights having a block-scaled fraction data format;
Winograd conversion circuitry, coupled to the inputs of the first data format conversion circuitry, to convert each of the sets of filter weights to a corresponding Winograd set of filter weights;
floating point format conversion circuitry, coupled to the Winograd conversion circuitry, to convert the filter weights of each Winograd set of filter weights to a floating point data format; and
outputs to output the filter weights of each Winograd set of filter weights having the floating point data format;
a second memory coupled to the outputs of the first data format conversion circuitry to receive and store the filter weights of each Winograd set of filter weights having the floating point data format; and
a multiplier-accumulator execution pipeline having a plurality of multiplier-accumulator circuits, each of the multiplier-accumulator circuits having:
first inputs to receive image data;
second inputs coupled to the second memory to receive a respective one of the Winograd sets of filter weights having the floating point data format; and
multiply-accumulate circuitry to generate output data by performing multiply and accumulate operations using the image data received via the first inputs and the respective one of the Winograd sets of filter weights received via the second inputs.

11. The integrated circuit of claim 10 wherein the second memory comprises static random access memory (SRAM).

12. The integrated circuit of claim 10 further comprising second data format conversion circuitry to:
receive first filter data having constituent floating-point-format filter weights;
convert the floating-point-format filter weights of the first filter data to filter weights having the block-scaled fraction data format; and
output the filter weights having the block-scaled fraction data format
to the first memory for storage therein as the plurality of sets of filter weights.

13. The integrated circuit of claim 12 wherein:
the second data format conversion circuitry comprises circuitry to determine a largest exponent of the constituent filter weights of each one of the sets of the floating-point-format filter weights.

14. The integrated circuit of claim 13 wherein
the second data format conversion circuitry further comprises circuitry to right shift a fraction field of each constituent filter weight of the one of the sets of the floating-point-format filter weights having a smaller exponent than the largest exponent, round the fraction field to a block-scaled fraction (BSF) precision, and, if negative, perform a two's complement operation on the fraction field.

15. The integrated circuit of claim 10 further comprising second data format conversion circuitry to:
- receive first filter data having constituent integer-format filter weights;
- convert the integer-format filter weights of the first filter data to a block-scaled fraction data format, and
- output the filter weights having the block-scaled fraction data format
- to the first memory for storage therein as the plurality of sets of filter weights.

* * * * *